(12) United States Patent
Kang et al.

(10) Patent No.: US 7,978,522 B2
(45) Date of Patent: Jul. 12, 2011

(54) FLASH MEMORY DEVICE INCLUDING A DUMMY CELL

(75) Inventors: Hee-Soo Kang, Seoul (KR); Dong-Uk Choi, Seongnam-si (KR); Choong-Ho Lee, Yongin-si (KR); Sang-Gu Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 321 days.

(21) Appl. No.: 12/416,477

(22) Filed: Apr. 1, 2009

(65) Prior Publication Data
US 2009/0180317 A1   Jul. 16, 2009

Related U.S. Application Data

(63) Continuation-in-part of application No. 11/523,571, filed on Sep. 20, 2006, now Pat. No. 7,518,920.

(30) Foreign Application Priority Data

Jan. 9, 2006  (KR) .............................. 2006-0002310
Apr. 18, 2008  (KR) .............................. 2008-0036195

(51) Int. Cl.
*G11C 11/34* (2006.01)

(52) U.S. Cl. ............ 365/185.2; 365/185.17; 365/185.18

(58) Field of Classification Search ............... 365/185.2, 365/185.17, 185.18
See application file for complete search history.

(56) References Cited

U.S. PATENT DOCUMENTS

| 7,079,437 B2 * | 7/2006 | Hazama et al. .......... 365/210.12 |
| 7,239,556 B2 * | 7/2007 | Abe et al. ................. 365/185.33 |
| 2004/0113199 A1 | 6/2004 | Hazama et al. |
| 2005/0105359 A1 * | 5/2005 | Matsunaga ................... 365/222 |
| 2007/0159886 A1 | 7/2007 | Kang |
| 2008/0068890 A1 * | 3/2008 | Beltrami et al. ......... 365/185.17 |
| 2010/0097859 A1 * | 4/2010 | Shim et al. ................ 365/185.05 |
| 2010/0097862 A1 * | 4/2010 | Kang et al. ............... 365/185.17 |
| 2011/0044111 A1 * | 2/2011 | Hosono .................... 365/185.17 |

FOREIGN PATENT DOCUMENTS

| JP | 2004127346 | 4/2004 |
| KR | 1020060074179 A | 7/2006 |
| KR | 1020060110755 A | 10/2006 |

* cited by examiner

*Primary Examiner* — Tuan T. Nguyen
(74) *Attorney, Agent, or Firm* — Volentine & Whitt, PLLC

(57) ABSTRACT

A non-volatile memory device includes a selection transistor coupled to a bit line. The device also includes a plurality of memory cells serially coupled to the selection transistor and at least one dummy cell located between the plurality of memory cells. The dummy cell is turned off during a programming operation of a memory cell located between the dummy cell and the selection transistor.

20 Claims, 18 Drawing Sheets

| | Program | Read | Erase | Dummy Cell Program |
|---|---|---|---|---|
| WL(Select) | Vpgm | Vrd | 0 | Vpass |
| WL(Unselect) | Vpass | Vread | 0 | Vpass |
| DWL | Vpass | Vread | 0 | Vpgm |
| SSL | Vcc | Vcc | Floating | Vcc |
| GSL | 0 | Vcc | Floating | 0 |
| CSL | 0 | 0 | Floating | 0 |
| BL | BL(Sel)=0V BL(Unsel)=Vcc | 0.5V | Floating | 0V |

Fig. 13

| Symbol & Signal | | Bias Condition | | | | |
|---|---|---|---|---|---|---|
| | | PGM(case1) | | PGM(case2) | | |
| BL | BL | Vcc | Vcc | Vcc | Vcc | Vcc |
| SSL | SSL | Vcc | Vcc | Vcc | Vcc | Vcc |
| WL<63> | WL<63> | Vpass | Vpass | Vpass | Vpass | Vpass |
| ... | ... | | | | | |
| WL<N+2> | WL<N+2> | | Vpgm | | | Vpgm |
| WL<N+1> | WL<N+1> | | Vss | | Vpgm | Vss |
| WL<N> | WL<N> | Vpgm | Vpass | Vpgm | Vpass | Vpass |
| DWL | DWL | Vco | Vco | Vpass | Vco | Vco |
| WL<N-1> | WL<N-1> | Vpass | Vpass | Vpass | Vpass | Vpass |
| WL<N-2> | WL<N-2> | | | | | |
| WL<N-3> | WL<N-3> | | | | | |
| ... | ... | | | | | |
| WL<0> | WL<0> | | | | | |
| GSL | GSL | Vss | Vss | Vss | Vss | Vss |
| CSL | CSL | $V_{CSL}$ | $V_{CSL}$ | $V_{CSL}$ | $V_{CSL}$ | $V_{CSL}$ |
| | | Self Boosting | Local Self Boosting | Self Boosting | Local Self Boosting | Local Self Boosting |

Fig. 16

| Symbol & Signal | | Bias Condition | |
|---|---|---|---|
| | | Erase(case1) | Erase(case2) |
| BL | BL | 0 | 0 |
| SSL | SSL | 0 | Vcc |
| WL<63> | WL<63> | 0 | Vpass |
| ⋮ | ⋮ | | |
| WL<N+2> | WL<N+2> | | |
| WL<N+1> | WL<N+1> | | |
| WL<N> | WL<N> | | |
| DWL | DWL | Floating | Vpgm |
| WL<N-1> | WL<N-1> | 0 | Vpass |
| WL<N-2> | WL<N-2> | | |
| WL<N-3> | WL<N-3> | | |
| ⋮ | ⋮ | | |
| WL<0> | WL<0> | | |
| GSL | GSL | 0 | Vss |
| CSL | CSL | 0 | $V_{CSL}$ |

Note: For Erase(case2), the column spans with "0 &Vers (Bulk)" across the WL rows.

FLASH MEMORY DEVICE INCLUDING A DUMMY CELL

CROSS-REFERENCE TO RELATED APPLICATIONS

This is a continuation-in-part of U.S. non-provisional patent application Ser. No. 11/523,571, filed Sep. 20, 2006, the disclosure of which is incorporated herein by reference in its entirety. In addition, a claim of priority 35 U.S.C §119 is made to Korean Patent Application Nos. 2006-0002310 and 2008-0036195, filed Jan. 9, 2006, and Apr. 18, 2008, respectively, the disclosures of which are incorporated herein by reference in their entirety.

SUMMARY

The present invention generally relates to semiconductor memory devices, and more particularly, the present invention relates to NAND flash memory devices.

Generally, NAND flash memory devices are programmed and erased using Fowler-Nordheim (F-N) tunneling. In F-N tunneling, electrons are injected/discharged from/to a channel region into/from a floating gate due to a large voltage difference between the channel region and a control gate of a cell transistor. Because of the relative ease in programming and erasing NAND flash memory devices, NAND flash memory devices are known to have good data storage characteristics as compared to other non-volatile memory devices. Moreover, NAND flash memory devices are also capable of high density integration, low power dissipation, and durability of percussion. These and other such features have helped increase the usage of NAND flash memory devices in recent years.

For example, the NAND flash memory is increasingly considered as a substitute for hard disk driver (HDD) as an auxiliary memory unit that is known as a solid state disk (SSD). While a SSD is considered to be inferior in capacity and cost to the HDD, the SSD is considered to be superior in access speed, miniaturization, and durability of percussion to the HDD. Moreover, it is expected that the progress of design and process technologies may increase the capacity and decrease the cost of the SSD. For these reasons, the SDD may be increasingly used as an auxiliary memory unit instead of the HDD.

While an increase in the integration density of memory cells in a semiconductor device may help reduce the size of the device, an increase in integration density may also cause problems. For example, the more highly integrated the memory device is, the more closely the memory cells are formed. This reduction in space between the memory cells may lead to an increase in coupling between memory cells. Furthermore, as the integration degree of the flash memory device is increased, a string may include more memory cells. This increase in memory cells with less space between them may cause a charge sharing phenomenon that may reduce a boosted channel voltage (e.g., about 9V) to a lower channel voltage (e.g., about 6V). The lowering of the channel voltage may make program-inhibit cells programmed. This programming of program-inhibit cells is generally undesirable.

FIG. 1 shows a schematic circuit diagram of a string structure of a conventional flash memory device. Referring to FIG. 1, a string comprises a string selection transistor SST, a ground selection transistor GST, and 32 memory cells MC<0> through MC<31> connected in series between the string selection transistor SST and the ground selection transistor GST. A drain of the string selection transistor SST is connected to a bit line and a source of the ground selection transistor GST is connected to a common source line CSL. A control gate of the string selection transistor SST is connected to a string selection line SSL and a control gate of the ground selection transistor GST is connected to a ground selection line GSL.

For exemplary purposes, it is assumed that a memory cell 10 is to be programmed and an adjacent memory cell MC<30> to the memory cell 10 is to be program-inhibited. Furthermore, a self-boosting scheme is used to program-inhibit the adjacent memory cell MC<30>. According to the program-inhibit method using the self-boosting scheme, a ground voltage (e.g., 0V) is applied to the control gate of the ground selection transistor GST so as to block a ground path of a string. The ground voltage is also applied to a selected bit line BL<m> connected to a string that comprises the memory cell 10 to be programmed. In addition, a source voltage (e.g., Vcc) is applied to an unselected bit line BL<m+1> connected to a string that comprises the memory cell MC<30> to be program-inhibited. Simultaneously, the source voltage (Vcc) is applied to the string selection line SSL. According to this bias condition, a source of the string selection transistor SST that is connected to the unselected bit line BL<m+1> is charged up to a voltage of (Vcc−Vth) (Vth is a threshold voltage of the SST). At this time, the SST is shut off so that the string with the memory cell to be program-inhibited is electrically isolated from the unselected bit line BL<m+1>. That is, the channel with the memory cell to be program-inhibited is floated.

Under this condition, a program voltage Vpgm is applied to a selected word line WL<30> and a pass voltage Vpass is applied to each of unselected word lines WL<0> through WL<29> and WL<31>. As a result, the channel of the program-inhibit memory cell (MC<30>) is self-boosted due to the capacitive coupling between its gate and channel, with the channel being floated. Furthermore, the voltage difference between the gate and the channel is so small that the electrons do not tunnel to the floating gate, thereby preventing the program-inhibit memory cell (MC<30>) from being programmed.

While the above-mentioned self-boosting scheme may be used to program-inhibit a memory cell, this scheme may not work as well in a high integration density memory device. For example, as the number of memory cells in a string increases, the charge-sharing of the self-boosted channel of the program-inhibited memory cell MC<30> increases. This reduces the channel voltage in the program-inhibited memory cell MC<30>. The resulting channel voltage decrease increases the voltage difference between the gate and the channel. This increase in the potential difference between the gate and channel may lead to an undesirable programming operation.

A local self-boosting scheme may be used to solve the above-mentioned problem. As depicted in FIG. 1, arrows indicate a charge-sharing direction and a programming direction. According to the local self-boosting scheme, a ground voltage of 0V is applied to two unselected word lines disposed at both sides of a selected word line. Furthermore, a program voltage Vpgm is applied to the selected word line after the pass voltage Vpass (e.g., about 10V) is applied to the remaining unselected word lines. Under the bias condition, the channel of a program-inhibited memory cell is locally boosted and the inactivated channels of two memory cells adjacent to the program-inhibited memory cell enables charges in the locally boosted channel to be blocked. As a result, the channel voltage of the program-inhibited memory cell is preserved so that the F-N tunneling in the program-inhibited memory cell is prevented.

While the local self boosting scheme may be used to prevent F-N tunneling in the program-prohibited memory cell, the scheme has several drawbacks. For example, the higher integration of the flash memory may narrow the interval between word lines. The narrow interval between word lines may result in a large coupling ratio between a selected word line (being applied with Vpgm) and unselected word lines (being applied with 0V). In other words, the voltage of unselected word lines may increase because of the coupling with the selected word line. This means that the unselected memory cells supplied with 0V are turned on because of charge sharing. Thus, because of the relatively large coupling ratio between unselected world lines and a selected word line, it may be undesirable to apply the local self boosting scheme to a highly integrated flash memory.

FIG. 2 shows a cross-sectional view of a string in FIG. 1. Referring to FIG. 2, a source voltage Vcc is applied to a gate of a string selection transistor SST and a bit line BL<m+1>. In addition, a ground voltage of 0V is applied to a ground selection transistor GST. Furthermore, a program voltage Vpgm is applied to a gate of a cell transistor MC<30> which is a program-inhibited memory cell. A pass voltage Vpass is applied to the remaining unselected word lines, respectively. Under this bias condition, a channel voltage of the cell transistor MC<30> is self-boosted such that the channel charge density of the cell transistor MC<30> is much higher than that of respective unselected cell transistors. However, cell transistors MC<0>~MC<29> are turned on because they are supplied with the pass voltage Vpass which is much higher than a threshold voltage. For this reason, the channels of the unselected cell transistors MC<0>~MC<29> are formed. Especially, in a case where a cell transistor has a low threshold voltage (or an erased state), the size of the channel formed may be enlarged because of the pass voltage Vpass applied to the cell transistor. The capacitance formed by channels of the unselected cell transistors MC<0>~MC<29> may share the boosted channel charge of the cell transistor MC<30>. This charge sharing causes a drop in the channel voltage of the cell transistor MC<30>. This drop in the channel voltage of the cell transistor MC<30> may lead to an undesirable programming operation due to increase in a voltage difference between the gate and the channel.

The above-mentioned drawback may become an important issue in a NAND flash memory device which starts a programming operation from a word line WL<0> in an ascending order. In other words, in a case where a selected word line is closer to the string selection transistor SST, the number of cell transistors which cause the charge sharing increase. This means that the total capacitance of channels increases as a selected word line becomes closer to the string selection transistor SST. Accordingly, as the channel capacitance of the unselected cell transistors increases, the charge shared amongst the cell transistor MC<30> and the unselected cell transistors increases, thus increasing the likelihood that the cell transistor MC<30> is programmed.

FIG. 3 shows a channel voltage drop caused by the charge sharing at a program-inhibited cell transistor. Referring to FIG. 3, the channel voltage of a memory cell MC<30> is set up to a voltage of Vcc-Vth when string and ground selection transistors SST and GST are biased to boost its channel. Furthermore, when the program voltage (Vpgm) is applied to the gate of the memory cell MC<30> at time t1, the channel of the program-inhibited memory cell MC<30> should be boosted up to Vch1 to inhibit F-N tunneling. However, the charge sharing causes the boosted channel voltage Vch1 (about 9V) to fall down to Vch2 (about 6V). This reduction in the voltage level of the channel in, the program-inhibited memory cell MC<30> due to charge sharing may cause the memory cell MC<30> to be programmed.

The present disclosure is directed towards overcoming one or more of the problems associates with conventional flash memory devices.

SUMMARY OF THE INVENTION

According to an aspect of the present invention, a non-volatile memory device is provided which includes a selection transistor coupled to a bit line, a plurality of memory cells serially coupled to the selection transistor, and at least one dummy cell disposed between the plurality of memory cells. The at least one dummy cell is turned off during a programming operation of a memory cell located between the dummy cell and the selection transistor.

According to another aspect of the present invention, a non-volatile memory device is provided which includes a selection transistor coupled to a bit line, a plurality of memory cells serially coupled to the selection transistor, and at least one dummy cell disposed between the plurality of memory cells. The at least one dummy cell is selectively turned-off according to a location of a programmed one of the plurality of memory cells during a programming operation.

According to yet another aspect of the present invention, a method for programming a non-volatile memory device is provided which include floating the channel of a program inhibited cell string, and boosting the floated channel into a plurality of channel areas, where the plurality of channel are separated from the floated channel by turning off a dummy cell located between a plurality of memory cells of the cell string.

BRIEF DESCRIPTION OF THE DRAWINGS

The above and other aspects and features of the present invention will become readily understood from the detailed description that follows, with reference to the accompanying drawings, in which:

FIG. 13 is a table illustrating a program method according to exemplary embodiments of the present invention;

FIG. 16 is a table illustrating erase operations for holding a threshold voltage of a dummy cell;

DETAILED DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

Figure 1:
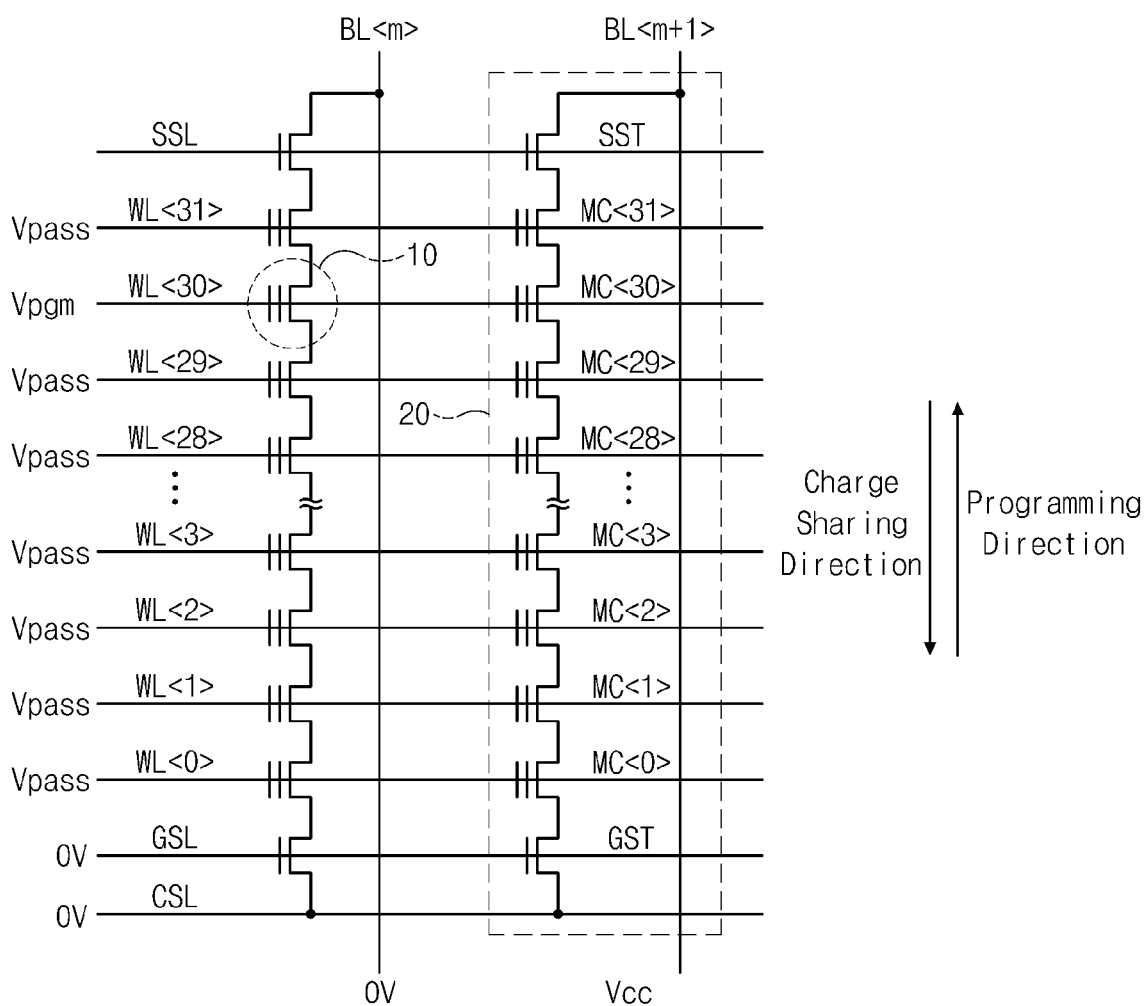
FIG. 1 is a schematic circuit diagram showing an array structure of a conventional NAND flash memory device.
Figure 2:
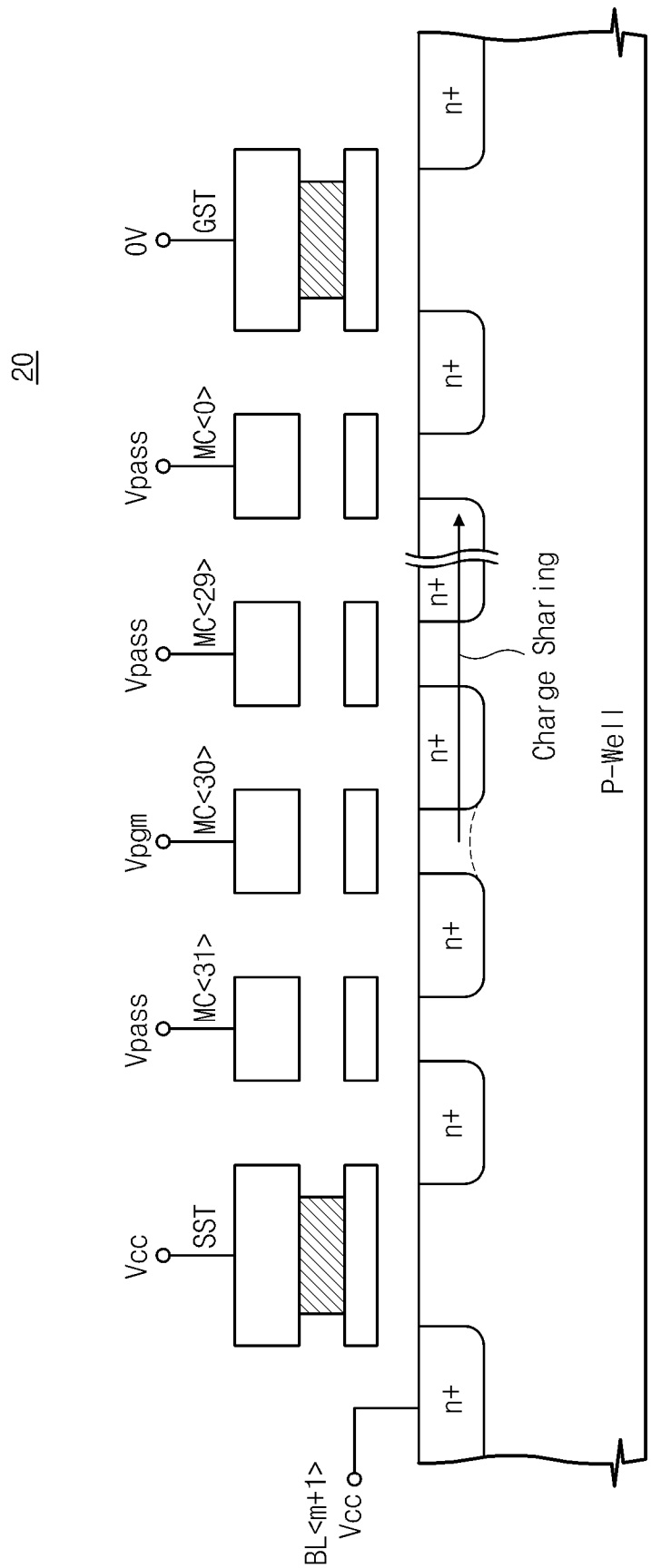
FIG. 2 shows a cross-sectional view of an unselected string in FIG. 1.
Figure 3:
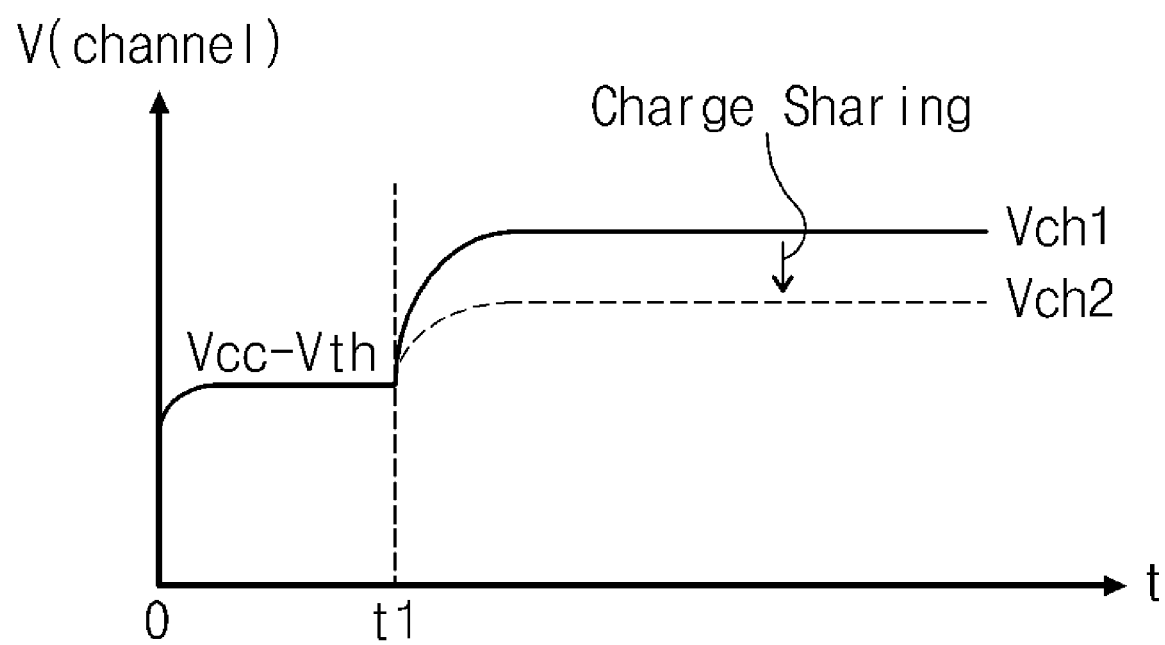
FIG. 3 shows channel voltage variations in the conventional NAND flash memory device of FIG. 1 caused by charge sharing.
Figure 4:
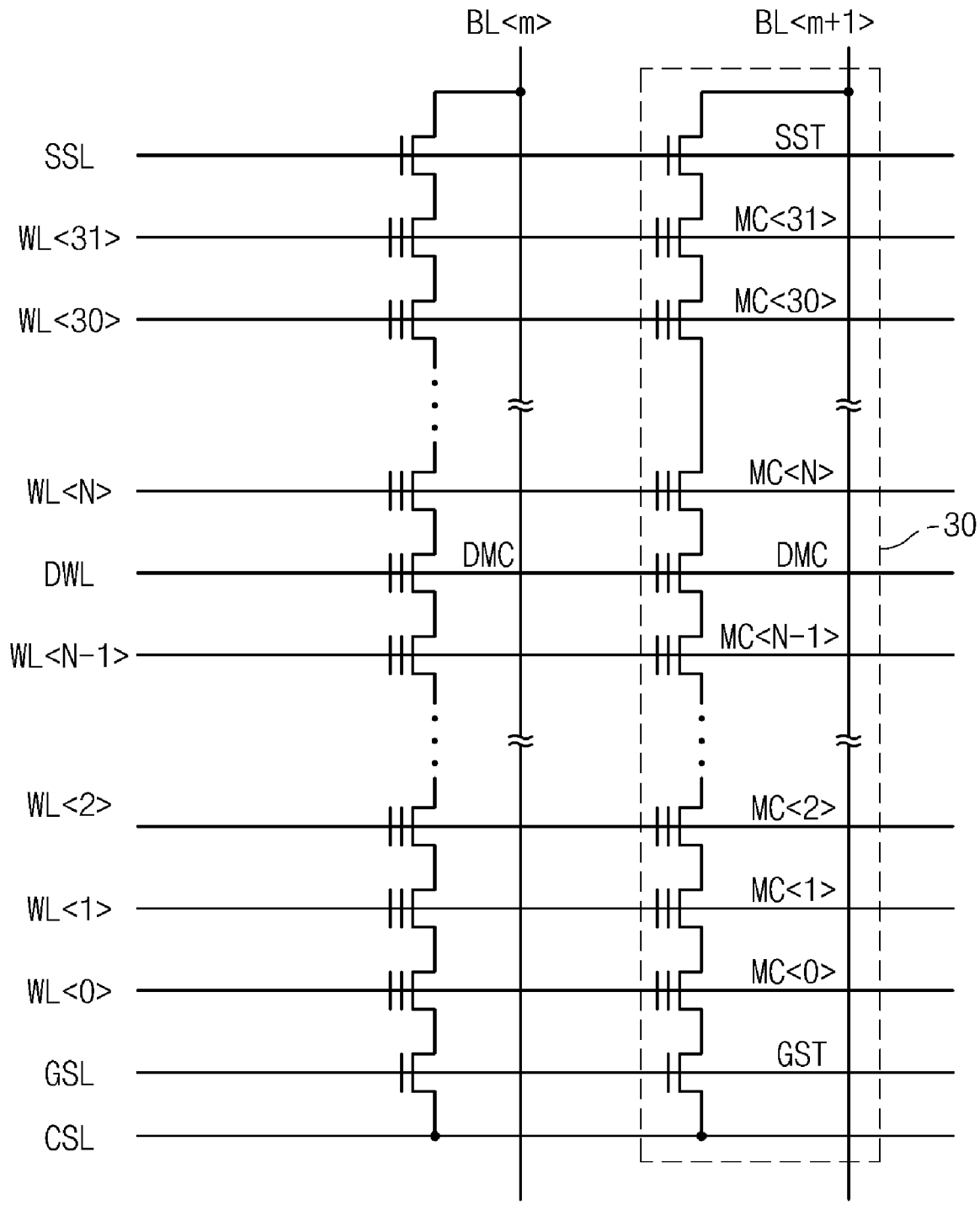
FIG. 4 is a schematic circuit diagram showing an array structure according to an exemplary embodiment of the present invention.

FIG. 4 shows a schematic circuit diagram of an array structure according to an exemplary embodiment. Referring to FIG. 4, a dummy cell DMC is placed in each of strings 30. In each string 30, the dummy cell DMC blocks the sharing of charges being boosted in a channel of a program-inhibited cell. Furthermore, in each of the strings 30, the dummy cell DMC has the same characteristics and performance as other memory cells in a corresponding sting. Generally, each of the strings includes 32 memory cells (hereinafter, referred to as a "main cell"). However, in an exemplary embodiment, the string further comprises at least one dummy cell together with 32 memory cells, one of which will be defined by an external address. The dummy cell may be placed at any location in the string. Yet, it may be beneficial to place the dummy cell at a position where the charge sharing of a program-inhibited memory cell is minimized.

Still referring to FIG. 4, for example, a dummy cell is placed between a memory cell MC<N−1> and a memory cell MC<N>. This arrangement may be repeated in each string that constitutes a memory block. That is, dummy cells in strings are placed so as to be connected in common to a dummy word line DWL. As described above, the position of the dummy cells DMC is designated so as to block the charge sharing that occurs due to the memory cell MC<N−1>.

The position of the dummy cells DMC may be determined during a test run of the manufacturing process. This is because the charge sharing characteristics of the memory cells usually depends on the type of manufacturing process. Thus, the position of the dummy cells DMC may be determined after estimating their performance based on their positions during the test run of the manufacturing process. The estimated position of the dummy cells DMC may be stored using a variety of methods. For example, the estimated position of dummy cells can be stored using a fuse option circuit or non-volatile memory cells.

In order to ensure that a program-inhibit cell cannot be programmed, each of the dummy cells DMC is programmed to have the highest state (refer to FIG. 6) before performing a programming operation of main cells. Furthermore, the same or lower voltage as that applied to unselected word lines is applied to the dummy word line DWL. This may ensure that a memory cell in a selected word line and an unselected bit line is concretely program-inhibited. Therefore, the reliability of the flash memory device can be improved.

Figure 5:
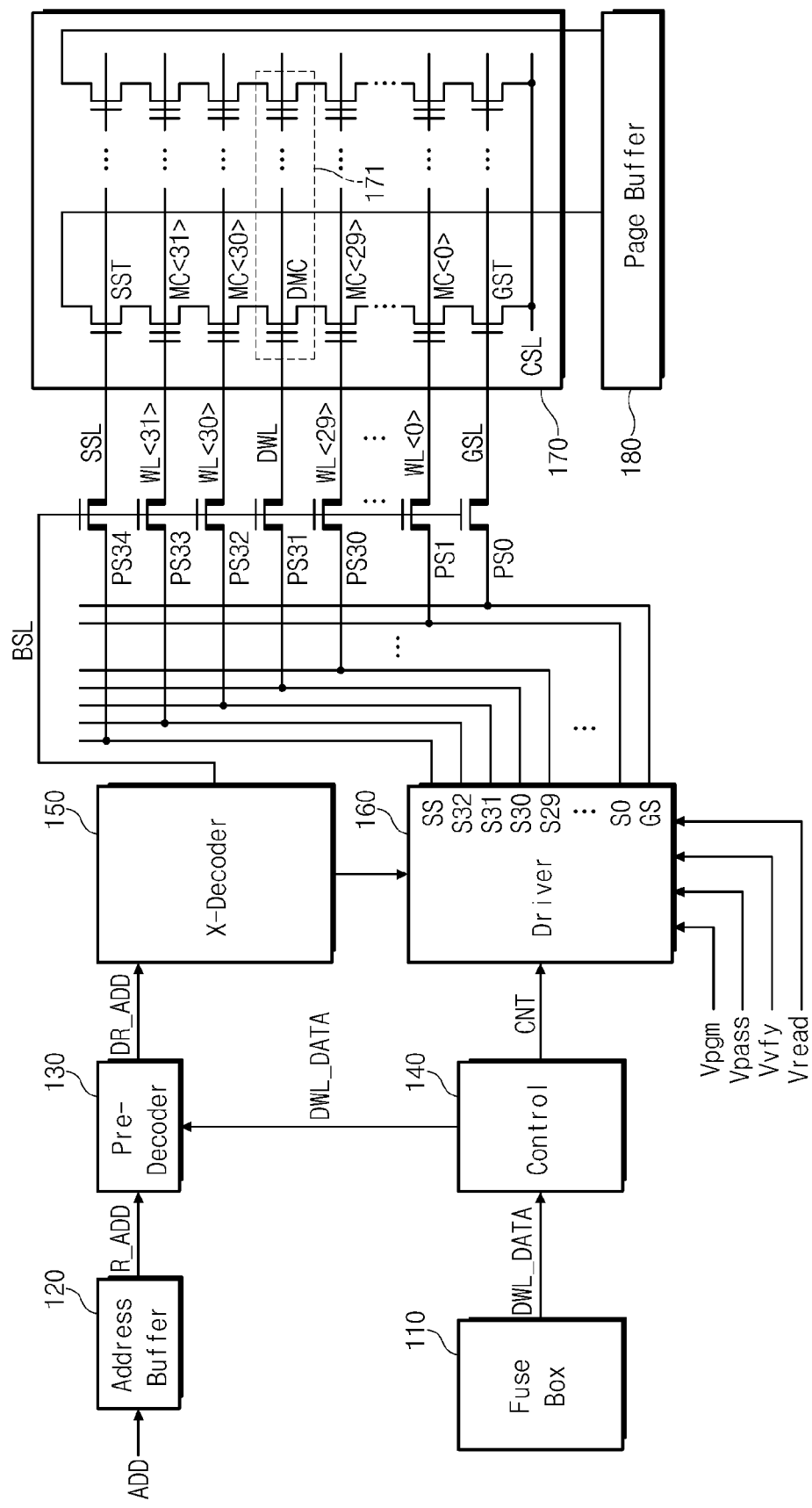
FIG. 5 is a block diagram of a flash memory device according to an exemplary embodiment of the present invention.

FIG. 5 shows a schematic block diagram of a NAND flash memory device according an exemplary embodiment. The NAND flash memory device includes a fuse box 110, an address buffer 120, a pre-decoder 130, a control unit 140, an X-Decoder 150, a driver block 160, a block of memory cells 170, and a page buffer 180. The flash memory device also includes strings of memory cells, each string including memory cells MC<0>-MC<31>. In addition, word lines WL<0>-WL<31> are applied to corresponding memory cells. Furthermore, the flash memory device also includes dummy memory cells DMC 171 in each string. Each DMC 171 is applied a dummy line voltage.

In an exemplary embodiment, the flash memory device is supplied with an external row address R_ADD which has no information for selecting a dummy word line in a block. However, an internal row address DR_ADD having information for selecting a dummy word line is generated by the pre-decoder 130 based on dummy word line data DWL_DATA that is stored in a fuse box 110. Thus, the dummy word line DWL can be supplied with the same word line voltage as the word line voltage that is supplied to the unselected word line during the programming and reading operations. The dummy cells are programmed to the highest state during the dummy cell program operation which is performed after a block erase operation.

Referring to FIG. 5, the flash memory device is configured to apply the dummy word line voltage. The dummy word line voltage may be applied in response to dummy word line data DWL_DATA. The DWL_DATA may be stored in a fuse box 110. As mentioned above, the dummy word line voltage is the same or lower than the voltage applied to unselected word lines during a programming/reading operation. Furthermore, a program voltage is supplied to a dummy word line DWL to program the dummy cells 171 into the highest state after a block erase operation.

As mentioned above, the fuse box 110 is configured to store the dummy word line data DWL_DATA. The DWL_DATA comprises position information of a dummy word line DWL in a block. Similar to the position of the dummy cells as described above, the position of the dummy word line DWL may vary according to the manufacturing process used for the flash memory device. For example, as described above, the position information of the dummy word line DWL can be determined after estimating its performance based on DWL positions during a test manufacturing process. In addition, the estimated position data of the dummy word line is saved/ programmed as the dummy word line data DWL_DATA into the fuse box 110. Although the fuse box 110 is used to store the dummy word line data DWL_DATA, one skilled in the art will appreciate that other components may be used to store the dummy word line data DWL_DATA. For example, non volatile memory may be used to store the dummy word line data DWL_DATA.

The address buffer 120 transmits an external address ADD to the pre-decoder 130. The address buffer 120 then translates this external address ADD to a row address R_ADD. The pre-decoder 130 translates the row address R_ADD from the address buffer 120 to an address DR_ADD. This translation is performed in response to the dummy word line data DWL_DATA received by the pre-decoder 130 from the control unit 140. The address DR_ADD comprises a dummy word line address. While the row address R_ADD has no information for selecting the dummy word line, the row address DR_ADD has the information needed for selecting the dummy word line.

For example, if the number of word lines to be selected by the external row address is 32, the pre-decoder 130 generates the internal row address DR_ADD to select 33 word lines. Thus, the pre-decoder 130 includes information about the additional word line, i.e., the DWL. As is well known by one skilled in the art, the number of word lines in a block is not limited hereto.

The control unit 140 controls the driver block 160. The driver block 160 is configured to execute the programming, erasing, reading operations of the flash memory device including the dummy word line. Specifically, the control unit 140 controls the driver block 160 to supply a word line voltage to a word line WL<0>. In addition, the control unit 140 controls the pre-decoder 130 to skip the programming operation of the dummy word line during a block programming operation. Furthermore, the control unit 140 controls the driver block 160 to apply the same word line voltage to the DWL as that applied to unselected word lines during the reading operation. During the erase operation, the control unit 140 controls the driver block 160 to apply a ground voltage to all word lines. This application of a ground voltage to all word lines may help the control unit 140 execute an erase operation when, for example, an erase voltage (e.g., 18V) is applied to a p-type well of the block.

Figures 6, 7:
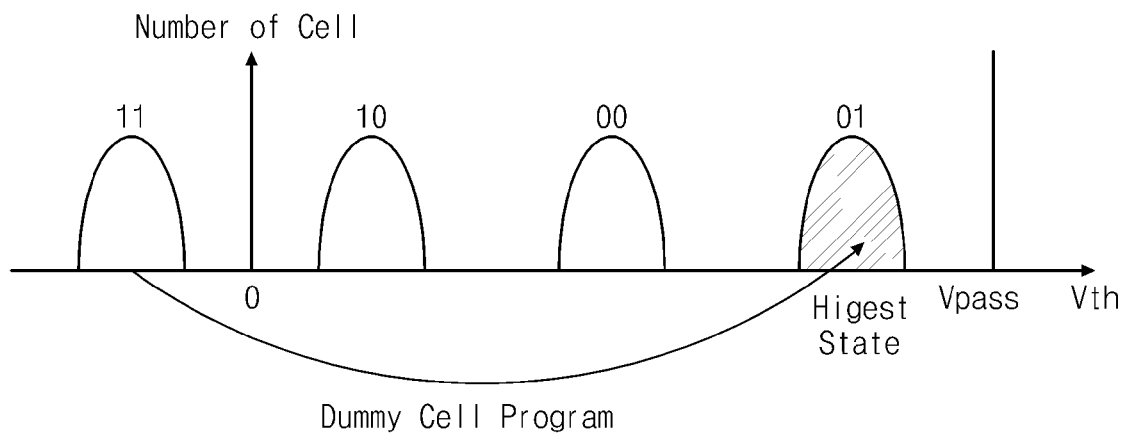
FIG. 6 is a diagram for describing an exemplary programming operation of a dummy cell in FIG. 5.
FIG. 7 is a table showing bias conditions according to an exemplary programming operation of the dummy cell.

After the erasing operation, the control unit 140 controls the driver block 160 to apply the program voltage to the word line so that the dummy cells are programmed into the highest state (refer to FIG. 6). At this point, the page buffer block 180 will bias all bit lines in a block to program all dummy cells into the highest state. In other words, the control unit 140 controls the driver block 160 and pre-decoder 130 to control the operation of the flash memory device notwithstanding the difference in the address between external row address and internal row address in response to the dummy word line data DWL_DATA.

The X-decoder 150 selects the block of cells to be programmed according to the internal row address from the pre-decoder 130. Specifically, the X-decoder 150 selects the block by activating a block selection line BLS. The block selection line BLS commonly switches on/off high voltage switches PS0~PS34. Furthermore, the X-decoder 150 transmits the internal row address to the driver block 160. Thus, the X-decoder 150 selects 32 word lines WL<0>-WL<31>, the dummy word line DWL, and 2 selection lines SSL and GSL.

The driver block 160 applies word voltages and selection line voltages in accordance with a control signal CNT from the control unit 140 and an internal row address from the X-decoder 150. For example, the driver block 160 applies the program voltage Vpgm to the selected word line and the pass voltage Vpass to unselected word lines during the programming operation. In addition, the driver block 160 applies a verifying voltage Vvfy to the selected word line and the read voltage Vread to the dummy word line (DWL). Furthermore, the driver block 160 applies the same voltage to the DWL as that to the unselected word lines during a reading operation.

In particular, during an erase operation, the driver block 160 applies a ground voltage (0V) to all word lines including the dummy word line and then the erase voltage to the p-type well, so that all memory cells in the block 170 are erased at the same time. After the erase operation, the dummy cell is programmed under the control of the control unit 140, which will be referred to as a 'dummy cell program'. In an exemplary embodiment, the dummy cell program operation is part of the erase process. During the dummy cell program operation, dummy cells are programmed to be at the highest state among the possible states the dummy cell can be in. For example, as illustrated in FIG. 6, each dummy cell is programmed to be at a state [01], i.e., the state within the highest threshold voltage distribution.

Referring back to FIG. 5, the cell array 170 comprises plural blocks each of which contains one dummy word line that is connected in common to dummy cells. While only one block is illustrated in FIG. 5, one skilled in the art will appreciate that the cell array 170 may includes more blocks that are configured to have the same string structure as illustrated in FIG. 5.

The page buffer block 180 is configured to store data to be programmed through the bit lines to the cell array. Although not illustrated in FIG. 5, the page buffer block 180 may be configured to comprise latches corresponding to bit lines or a half of the bit lines. During a read operation, the page buffer block 180 senses data of selected memory cells through the bit lines. The sensed data is transmitted to an external circuit through a column pass gate (not shown). On the other hand, during a programming operation, data to be programmed to the memory cell 170 is latched in the page buffer block 180. Furthermore, the page buffer block 180 is configured to set up the bit lines with a ground voltage (0V) during the dummy cell program operation so as to program the dummy cells to the highest state possible.

FIG. 6 is a diagram illustrating a dummy cell program operation performed after a block erase operation according to an exemplary embodiment. Referring to FIG. 6, a dummy cell is programmed to be shifted from an erase state [11] to the highest state [01] during the dummy cell program operation. Specifically, FIG. 6 illustrates four possible states [11], [10], [00] and [01] of a 4 level multi-leveled cell MLC. But as is well known to those skilled in the art, any number of states are possible. For example, a memory cell can be a multi leveled cell which stores 3-bit data. In this case, there would be eight possible states for the multi-leveled MLC.

The dummy cell programmed to the highest state can minimize the charge sharing to a program-inhibited cell in a string. This is accomplished by narrowing a channel that is formed by the pass voltage applied to the gate of dummy cell programmed to the highest state. Specifically, the threshold voltage of a cell transistor programmed to the highest state is distributed within a threshold voltage distribution of the highest state. Thus, when a dummy cell has a threshold voltage within a threshold voltage distribution corresponding to the highest state, its channel formed may be relatively short when a gate voltage is applied to the dummy cell. This shortened channel can minimize the charge sharing in a string when the pass voltage Vpass is applied to its gate.

FIG. 7 illustrates a table of the word line, bit line and selection line voltage supplied during the program, read, erase, and dummy cell program, operations in an exemplary embodiment.

In a programming operation, a program voltage Vpgm is applied to a selected word and a pass voltage Vpass is applied to unselected word lines. Furthermore, a power supply voltage Vcc is applied to a string selection line SSL. In addition, a ground voltage 0V is applied to a ground selection line GSL and a common source line CSL. Beneficially, during the programming operation, the pass voltage Vpass is also applied to a dummy word line DWL. Furthermore, a ground voltage 0V is applied to bit lines connected to cells to be programmed, and a power supply voltage Vcc is applied to bit lines connected to cells to be program-inhibited.

In a read operation, the power supply voltage Vcc is supplied to the string selection and ground selection lines SSL and GSL. In addition, the ground voltage 0V is applied to the common source line CSL. Also, a read voltage Vrd is applied to the selected word line. Furthermore, a pass voltage Vread is applied to the unselected word lines to turn on the channel of unselected cell transistors. The same pass voltage Vread is also applied to the DWL.

In an erase operation, all bit lines, the string selection line SSL, the ground selection line GSL, and the common selection line CSL are set to retain a floating state. The floating state means that signal lines are not connected to any voltage source. Furthermore, a ground voltage 0V is applied to all word lines including the dummy word line. In addition, an erase voltage (e.g., about 18V) is applied to the p-type well to induce the F-N tunneling, which extracts the electrons from the floating gate.

In an exemplary embodiment, after the erase operation, the dummy cell program operation is preformed to change the state of the dummy cells to the highest possible state. The dummy cell program is performed under the control of the control unit 140 (refer to FIG. 5). In order to program the dummy cells coupled to the dummy word line to the highest state, the page buffer block 180 applies the ground voltage of 0V to all bit lines. Furthermore, the pass voltage Vpass is applied to all word lines except the dummy word line DWL. At this time, as shown in FIG. 7, a power supply voltage Vcc is applied to the string selection line SSL. In addition, a ground voltage 0V is applied to the ground selection line GSL and the common source line CSL. Under the above-mentioned bias condition, the dummy cells are programmed to have the highest state.

As mentioned above, the bias conditions applied to the bit lines, selection lines, and word lines including the dummy word line are established by operating the control unit 140 based on dummy word line data DWL_DATA that is stored in a fuse box 110. In an exemplary embodiment, no further address is required to select a dummy word line. That is, the disclosed flash memory device is configured to select a dummy word line using internal information that is stored in a fuse box 110, together with an external address. For this reason, it may not be necessary to modify an external interface of the flash memory device.

Figure 8:
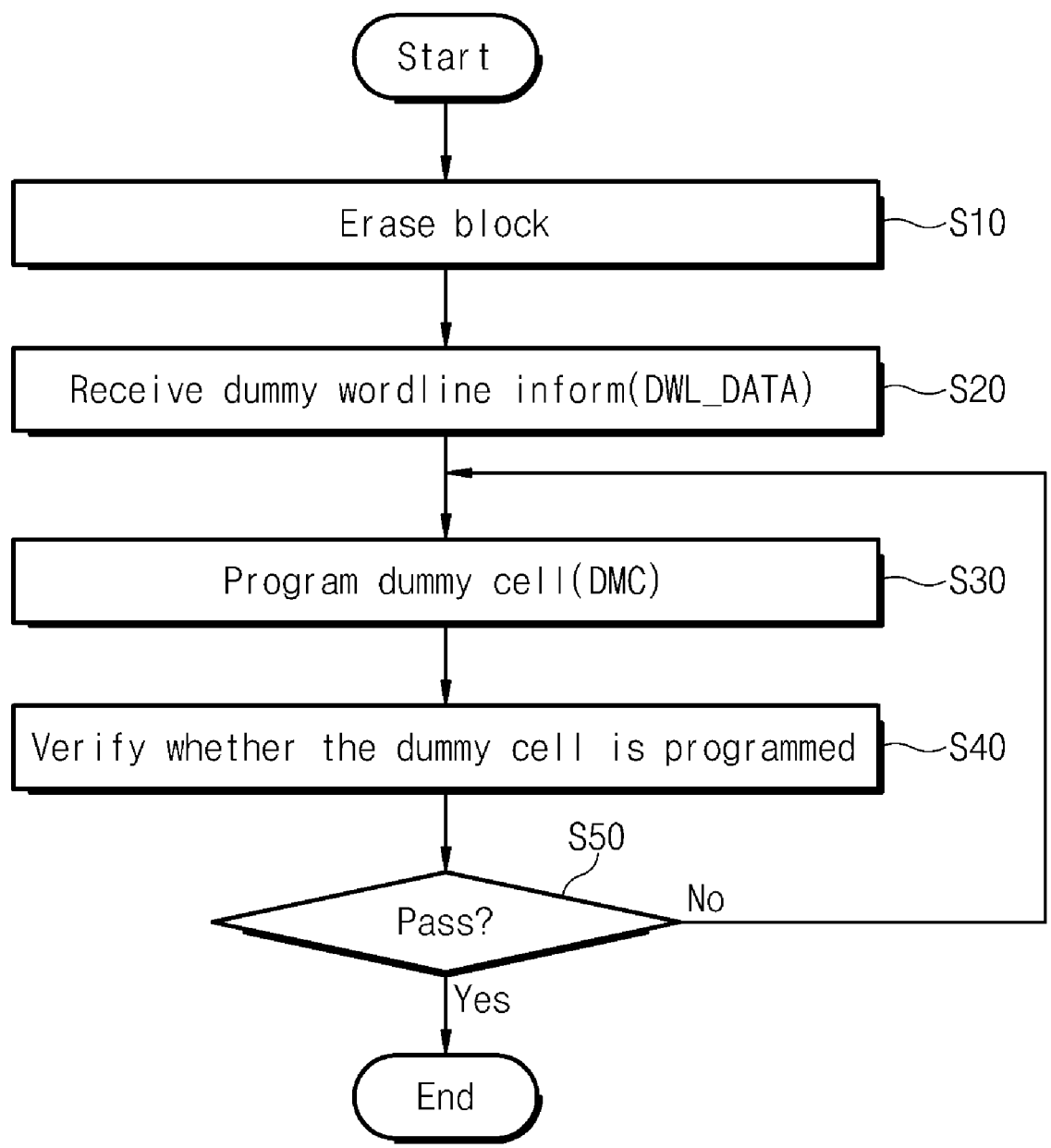
FIG. 8 is a flowchart illustrating an erasing operation according to an exemplary embodiment of the present invention.

FIG. 8 is a flowchart illustrating erase and dummy cell program operations in an exemplary embodiment. As far as initializing the memory cells is concerned, the dummy cell program operation can be categorized as an erase procedure in a broad sense. Hereinafter, the present erase procedure will be more fully described with reference to FIG. 8.

At the beginning of the erasing operation, at step S110, all memory cells in a target block are erased under the bias condition shown in FIG. 7. That is, the erased memory cells are initialized to have the lowest state (e.g., [11]). Furthermore, the control unit 140 generates the control signal CNT based on the dummy word line data DWL_DATA from fuse box 110. At step S20, the control unit 140 transmits the dummy word line data DWL_DATA to a pre-decoder 130 to generate the internal row address DR_ADD. At step S30, dummy cells are programmed to have the highest state (e.g., [01]). In particular, a program voltage Vpgm is applied to a dummy word line so that dummy cells are programmed to the highest state. In an exemplary embodiment, the dummy cell program operation may be executed using the ISPP (Incremental Step Pulse Programming) scheme. However, one skilled in the art will appreciate that the dummy cell program operation is not limited to the ISPP scheme. After completing the dummy cell program operation, at step S40, the verifying operation for verifying programmed states of dummy cells is performed. If all dummy cells are programmed to have the highest state, the dummy cell program operation may end. However, if any one of the dummy cells is not programmed to the highest state, the steps S30 to S50 are repeated until all dummy cells are sufficiently programmed to have the highest state.

The disclosed memory scheme including dummy memory cells may be used in any flash memory device. By programming the dummy cells to the highest possible state, it may be possible to minimize the above-mentioned charge sharing phenomenon while still increasing the number of memory cells in each string.

Figure 9:
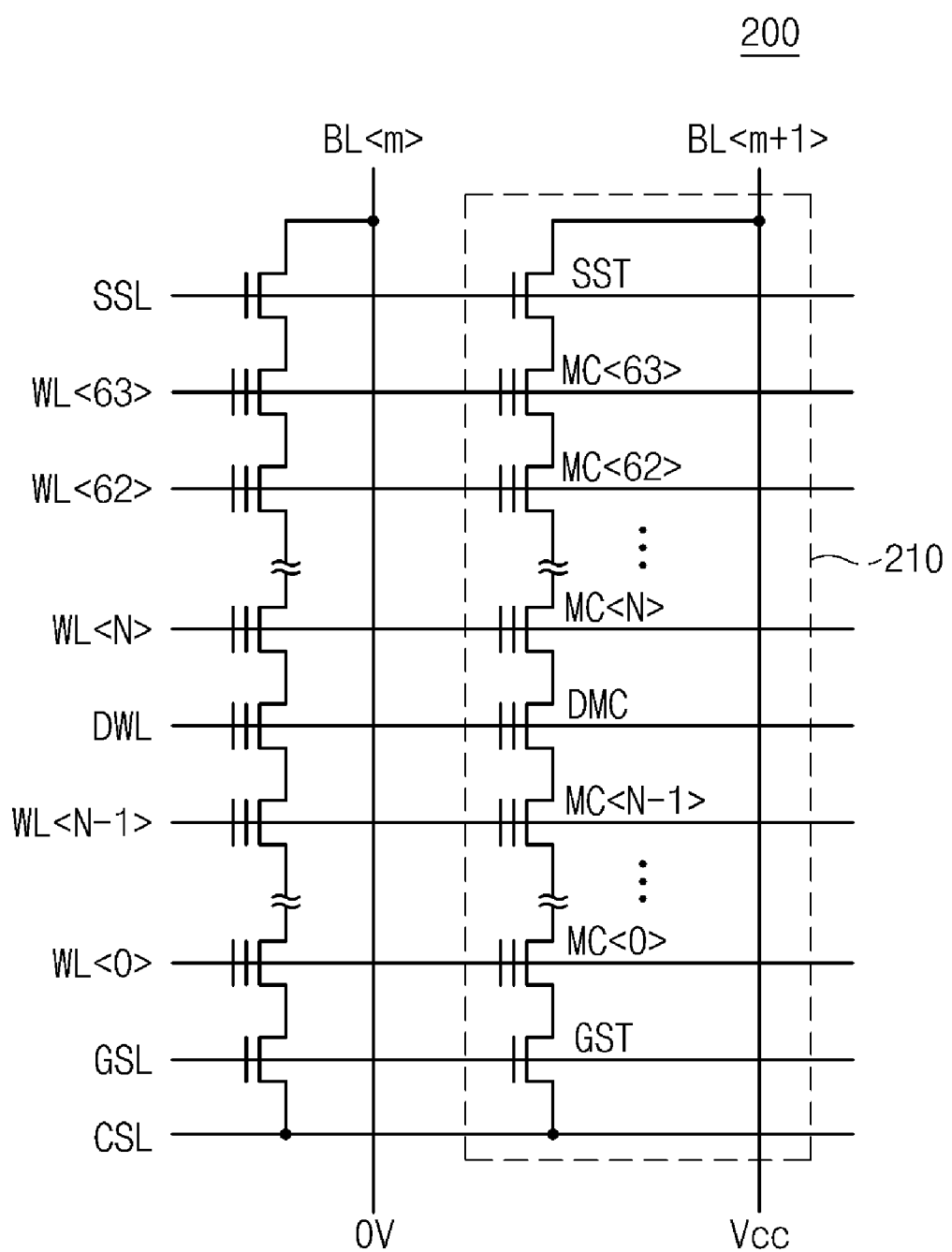
FIG. 9 is a circuit diagram of a cell string according to an exemplary embodiment of the present invention.

FIG. 9 shows a schematic circuit diagram of an array structure according to another exemplary embodiment. In the example of this embodiment, 64 memory cells MC<0>~MC<63> are arranged in a cell string 210, and a dummy cell DMC is inserted among the memory cells of the cell string 210. As described below, the configuration of FIG. 9 can enhance a boosting effect of a channel for program inhibiting.

The dummy cell DMC has the same characteristics and performance as other memory cells in a corresponding string 210. As will be explained in more detail with reference to FIG. 100, in the case of forming 64 memory cells in a cell string by using a SADP (SelfAligned Double Patterning) technology, 67 cell transistors are formed consequently. Three cell transistors among the 67 cell transistors are used as dummy cells. In order to form 32 memory cells in a cell string by using a SADP (SelfAligned Double Patterning) technology, 35 cell transistors are formed consequently. The three cell transistors among the 35 cell transistors are used as dummy cell. In order to block effects of the selection transistors, each of two dummy cells of the three dummy cells is placed adjacent to the selection transistors SST, GST. Although not shown by circuit diagram, the two dummy cells adjacent to the selection transistors may be configured to operate the same as the selection transistor or memory cell. Another dummy cell DMC of the three dummy cells is placed between a memory cell MC<N−1> and a memory cell MC<N>.

As mentioned above, the position of the dummy dell DMC may be determined at any location in the cell string 210. Yet, it may be beneficial to place the dummy cell at a position where the charge sharing of a program-inhibited memory cell is minimized. For example, the dummy cell DMC may be placed in the middle of the cell string 210. Otherwise, the dummy cell DMC may be placed at a located shifted from the middle of the cell string 210 towards the string selection transistor SST or ground selection transistor GST.

Referring back to FIG. 9, a cut-off voltage Vco is supplied to a dummy word line in order to enhance the boosting efficiency of the program-inhibited cell string. The channel formed by a floating and a boosting effect is divided into two channel regions at both sides of the dummy cell. For this condition, the charge sharing from the upper side (i.e in the direction of SST) channel region to the lower side (i.e, in the direction of GST) can be blocked. Hence, the boosted voltage of the upper side channel can be preserved due to the blocking of a charge sharing effect.

The cell transistors being placed between a word line WL<N−1> and word line WL<N> are designated as a dummy cell DMC, and a word line connected to the dummy cell DMC is designated as dummy word line DWL. The position of the dummy cells DMC may be determined after estimating their performance based on their positions during a test run in a manufacturing process. The estimated position of the dummy cells DMC may be stored using a variety of methods. For example, the estimated position of dummy cells can be stored using a fuse option circuit or non-volatile memory cells.

In order to ensure that a program-inhibit cell cannot be programmed, each of the dummy cells DMC is programmed to have the highest state before executing a programming operation of the main cells. Furthermore, the same or lower voltage as that applied to unselected word lines is applied to the dummy word line DWL. This may ensure that a memory cell in a selected word line and an unselected bit line is securely program-inhibited. Therefore, the reliability of the flash memory device can be improved.

Figure 10:
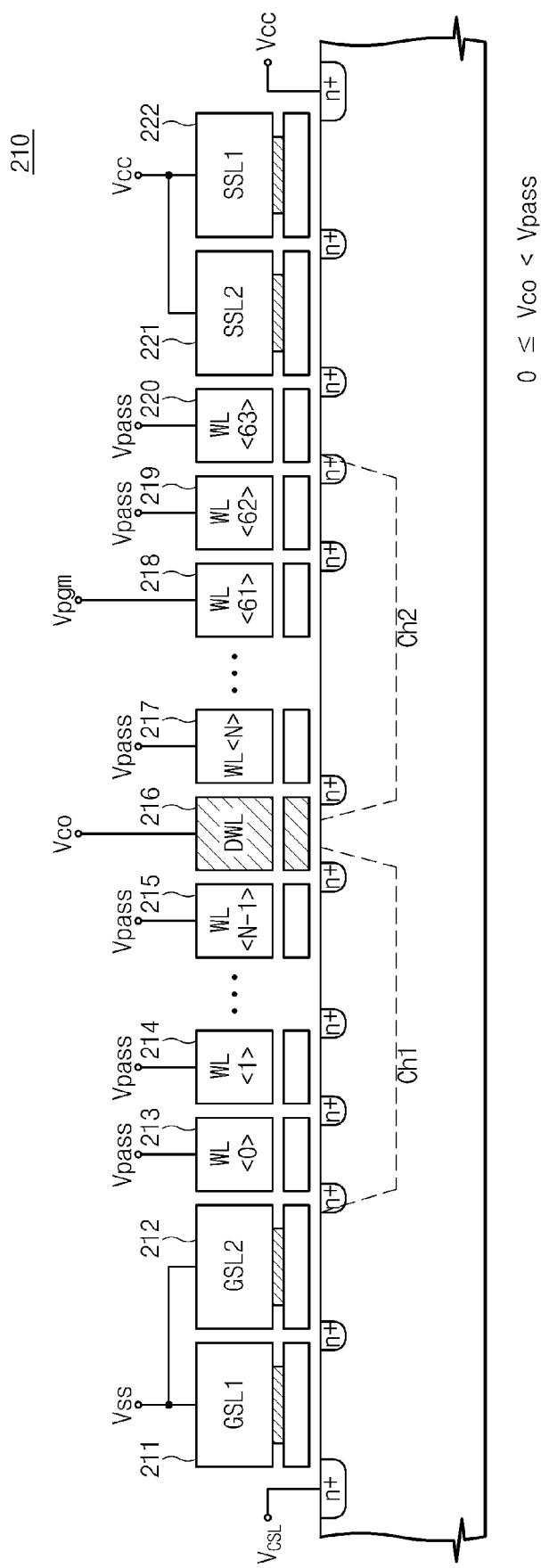
FIG. 10 is a diagram illustrating the channel region isolation effect resulting from a dummy word line according to an exemplary embodiment of the present invention.

FIG. 10 illustrates a cross-sectional view of a cell string shown in FIG. 9. The cell string of FIG. 10 shows an example in which dummy lines 212, 221 adjacent to the selection transistors GSL1, SSL1(211, 222) respectively have the same performance characteristics as the selection transistors 211, 222. Referring to FIG. 10, a source voltage Vcc is applied to a gate of a string selection transistor SST1, SST2 and a bit line. As mentioned above, the floated channel by the source voltage applied to the bit line BL divided into a first channel Ch1 and a second channel Ch2 due to the cut-off voltage Vco applied to the dummy word 216. Additionally, a program voltage Vpgm is applied to a word line WL<61> and a pass voltage Vpass is applied to the remaining unselected word lines, respectively. Under this bias condition, the voltage of the second channel Ch2 must be boosted sufficiently to block the program disturbance (which is a program effect of unselected memory cells). Thus, the cut-off voltage Vco is applied to the dummy word line DWL to block the voltage drop of the second channel Ch2. The floated channel is divided into two channels by the cut-off voltage Vco. Consequently, the charge sharing of the second channel Ch2 is blocked.

In particular, a source voltage Vcc is applied to the bit line BL and string selection lines SSL1, SSL2 during the program operation. In addition, a ground voltage Vss is applied to the ground selection lines GSL1, GSL2. A source line voltage $V_{CSL}$ is applied to the common source line. The channel of program inhibited cell sting is pre-charged by the source voltage Vcc supplied to the bit line until the string selection transistors are shut-off, which induces the channel to be floated.

Henceforth, the pass voltage Vpass is applied to the word lines WL<0>~WL<63> and the dummy word line DWL, and the floated channel voltage is boosted. After applying the pass voltage Vpass, the program voltage Vpgm is applied to the selected word line WL<61> and cut-off voltage Vco is applied to the dummy word line DWL. The floated channel is divided into a first channel Ch1 and a second channel Ch2 on the basis of the dummy word line DWL. Here, the cut-off voltage Vco is the same or higher than 0V and lower than pass voltage Vpass (i.e, 0≦Vco<Vpass). Furthermore, the application time of the cut-off voltage may be the same as that of the pass voltage Vpass.

As mentioned above, the charge sharing effect can be blocked by the channel division due to the cut-off voltage. Furthermore, the program disturbance of unselected memory cells can be suppressed due to the blocking of the charge sharing effect. The voltage of the second channel can be expressed by the following arithmetic formula 1;

$$Vch2 \propto \frac{n}{N}Vpass + \frac{1}{N}Vpgm$$

where n is the number of memory cells supplied with a pass voltage Vpass to boost the second channel Ch2, and N is the number of memory cells according to the second channel Ch2.

As shown by the arithmetic formula 1, the boosted voltage of the second channel is mainly dependant upon the pass voltage Vpass and the program voltage Vpgm. The charge sharing drops the boosted voltage of the second channel Ch2. The voltage drop of the boosted channel can cause a soft program due to an attenuation of electric field between the second channel and word line. However, cut-off voltage Vco applied to the dummy word line DWL divides the floated channel to thereby block the charge sharing effect, and consequently the boosted channel voltage can be preserved.

Herein, the technical feature of the present invention is explained based on the exemplary embodiment that the two dummy cells 212, 221 located outside of the cell string are used as the string selection line SSL2 and the ground selection line GSL2 respectively. However, present invention is not limited to the example of this embodiment. For example, as described next with reference to FIG. 11, the two dummy cells 212, 221 located outside of the cell string can be controlled independently on the string selection line SSL2 and the ground selection line GSL2.

Figure 11:
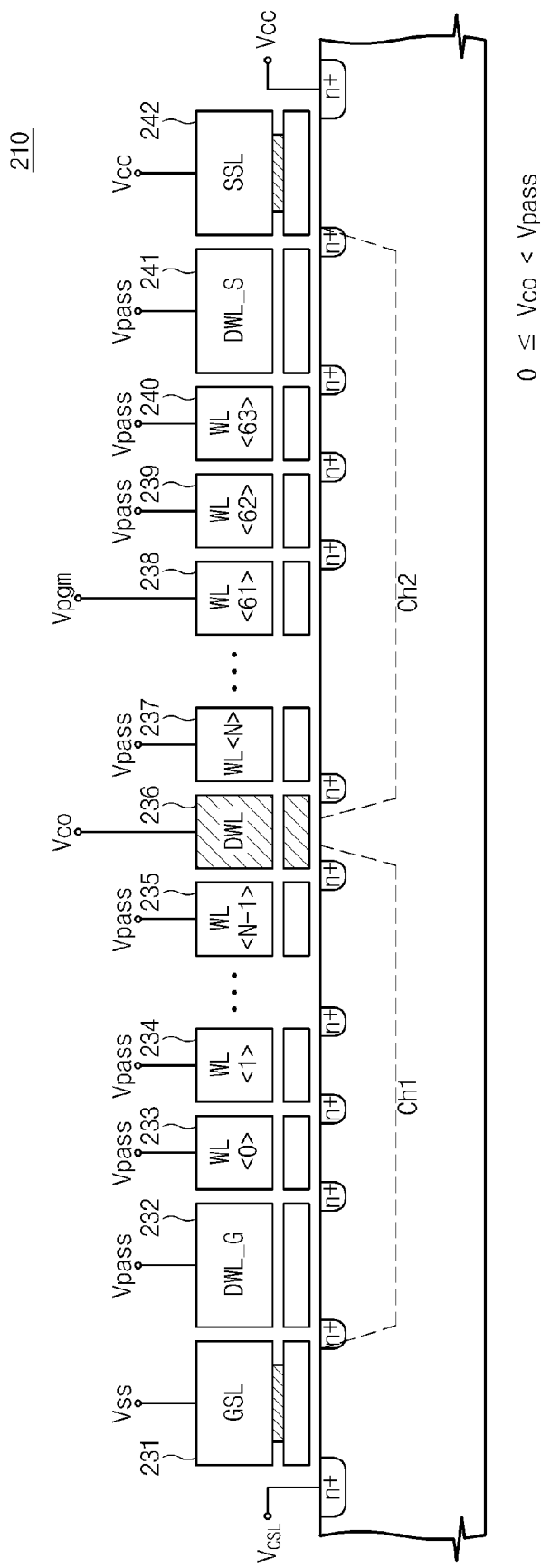
FIG. 11 is another diagram illustrating the channel region isolation effect resulting from a dummy word line according to an exemplary embodiment of the present invention.

FIG. 11 shows a cross-sectional view of a cell string of FIG. 9 according to another embodiment of the present invention. Referring to FIG. 11, a dummy lines 232, 241 (DWL_G, DWL_S) adjacent to the selection transistors GSL, SSL (231, 242) respectively form memory cells unlike those of shown in FIG. 10. In this case, dummy lines DWL_G, DWL_S can be controlled like as the unselected word line. The floated channel by the source voltage Vcc applied to the bit line BL divided into a first channel Ch1 and a second channel Ch2 due to the cut-off voltage Vco applied to the dummy word line 236. Further, then a program voltage Vpgm is applied to a word line WL<61> and a pass voltage Vpass is applied to the remaining unselected word lines, respectively. Under this bias condition, the voltage of the second channel Ch2 must be boosted sufficiently to block the program disturbance which is a program effect of unselected memory cells. Thus, the cut-off voltage Vco is applied to the dummy word line DWL to block the voltage drop of the second channel Ch2. The floated channel is divided into two channels by the cut-off voltage Vco. Consequently, the charge sharing of the second channel Ch2 is blocked.

During the program operation, a source voltage Vcc is applied to the bit line BL and string selection lines SSL. In addition, a ground voltage Vss is applied to the ground selection line GSL. A source line voltage $V_{CSL}$ is applied to the common source line CSL. The channel of program inhibited cell sting is pre-charged by the source voltage Vcc supplied to the bit line until the string selection transistors being shut-off, which induces the channel to be floated.

Henceforth, the pass voltage Vpass is applied to the word lines WL<0>~WL<63> and the dummy word lines DWL, DWL_G, DWL_S to thereby boost the floated channel voltage. After applying the pass voltage Vpass, the program voltage Vpgm is applied to the selected word line WL<61> and cut-off voltage Vco is applied to the dummy word line DWL. The floated channel is divided into a first channel Ch1 and a second channel Ch2 by the dummy word line DWL. Thus, the second channel voltage boosted by the program voltage Vpgm can be preserved by blocking the charge sharing.

Herein, the cut-off voltage Vco is the same or higher than 0V and lower than pass voltage Vpass (i.e, 0≦Vco<Vpass). Furthermore, the application time of the cut-off voltage might be the same as that of the pass voltage Vpass.

In FIG. 10 and FIG. 11, the technical feature of present invention is explained above with reference application of a self boosting scheme. However, the local self boosting scheme can be applied to the second channel Ch2, and consequently, the second channel Ch2 can be divided into a plurality of local channel regions. In other words, the control operation of the dummy word line DWL in accordance with the present invention is not dependent upon the channel boosting scheme described above.

Figure 12:
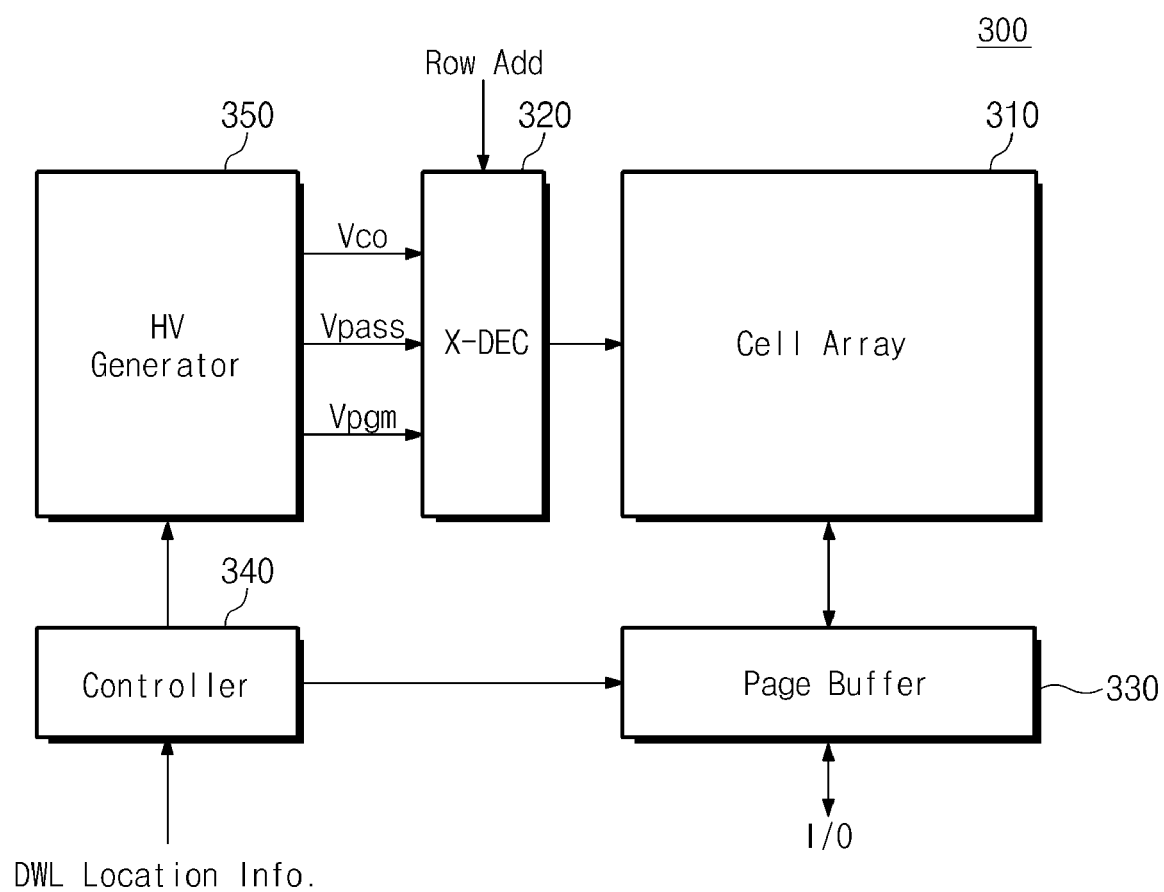
FIG. 12 is a block diagram of a flash memory device for conducting a program operation according to an exemplary embodiment of the present invention.

FIG. 12 shows a block diagram of a flash memory device 300 including a dummy word line DWL. Referring to FIG. 12, the flash memory 300 generates the cut-off voltage Vco and supplies to the dummy word line DWL of a cell array 310 during the program operation. Further, the dummy cells maintain the program stage which corresponds to the highest threshold voltage under the control of the control block 340.

The cell array 310 includes a plurality of memory blocks. A cell string in each memory blocks has the dummy word line DWL. The use of the dummy word lines adjacent to the selection lines GSL, SSL can be varied. However, the position of the dummy word line DWL located between the word lines may be designated in accordance with the Design rule or manufacturing process. For instance, the position of the dummy word line DWL can be designated in order to block the charge sharing effect which causes program disturbance in the thirty-two cell string structure. Otherwise, the position of the dummy word line DWL can be designated in the middle of the cell string in the sixty-four cell string structure. It will be apparent to those skilled in the art that the position of the dummy word line DWL can be modified arbitrarily in response to various test processes.

An X-decoder 320 transmits a high voltage from a high voltage generator 350 to word lines and selection lines SSL, GSL in response to the row address. The X-decoder 320 performs decoding function that decodes the row address of a selected memory cell for programming, and a word selection function that selects word line in accordance with the decoded row address. Further, the X-decoder 320 transmits the high voltages to the selected word line and unselected word lines. The X-decoder 320 applies a program voltage Vpgm to the selected world line during the program operation. The X-decoder 320 applies a pass voltage Vpass to the unselected word lines.

The X-decoder 320 applies the cut-off voltage Vco or the pass voltage Vpass to the dummy word line DWL during the program voltage Vpgm application period to the selected word line. In other words, in case of the program operation of the memory cell located at lower side of the dummy word line DWL, the X-decoder 320 applies the pass voltage Vpass to the dummy word line DWL. When the program operation of the memory cell located at upper side of the dummy word line DWL, the X-decoder 320 applies the cut-off voltage Vco to the dummy word line DWL. In addition, when the program operation of the memory cell connected to the word line WL<N> adjacent to the dummy word line DWL, the X-decoder 320 applies the pass voltage Vpass to the dummy word line DWL instead of applying the cut-off voltage Vco to minimize the coupling effect. The X-decoder 320 floats the dummy word line DWL to inhibit erasure of the dummy cells during an erase operation.

The page buffer 330 writes data into the memory cell array 310 or reads data from the memory cell array 310. The page buffer 330 is connected to the memory cell array 310 by a plurality of bit lines. The page buffer 330 includes a plurality of latches (not be seen) which are connected to each of the plurality of bit lines respectively. Each of the latches saves program data or read data. During the program operation, the page buffer 330 applies ground voltage (0 V) or source voltage (Vcc) to the bit lines in accordance with saved data of the latches. For example, a bit line connected to a latch saving logic '0' is supplied with a ground voltage 0V during the program operation. Further, a bit line connected to a latch saving logic '1' is supplied with source voltage Vcc during the program operation.

The controller 340 selects application voltages of the word lines and selection lines SSL, GSL referring to DWL Location Info. During the program operation, the controller 340 controls the high voltage generation 350 to supply the dummy word line with cut-off voltage Vco, to supply a selected word line with program voltage Vpgm, and to supply unselected word lines with pass voltage Vpass. In addition, the controller 340 controls the high voltage generation 350 to supply the dummy word line with pass voltage Vpass during the program operation of a memory cell connected to word line WL<N> which is adjacent to the dummy word line DWL. During the read operation, the controller 340 controls the high voltage generation 350 to supply the dummy word line with read voltage Vread, like an unselected work line. During the erase operation, the controller 340 controls the high voltage generation 350 and page buffer 330 to erase the dummy cells and other memory cells simultaneously. Further, then the controller 340 controls the high voltage generation 350 and page buffer 330 to program the dummy cells into the highest threshold state. After programming to the highest state, the dummy cells are prohibited from erasure by being floated during the block erase operation. Herein, the DWL Location Info can be supplied from a fuse box or read from the designated area of the cell array 310 and supplied to the controller 340 during the power-on operation or initialization operation of the flash memory device 300.

The high voltage generator 350 operates to generate word line voltages (e.g., a program voltage, a read voltage, and a pass voltage) which are applied to the word lines in accordance with operation modes, in response to the controller 340. Moreover, the high voltage generator 350 also outputs cut-off voltage Vco to be applied to the dummy word line DWL.

The cut-off voltage Vco is applied to the dummy word line to divide a boosted channel of the program inhibited cell string during the program operation. Accordingly, the cut-off voltage Vco can be ground voltage level (0V). In addition, the cut-off voltage Vco can be a voltage level that turns off the dummy cell of which the threshold voltage is in the highest program (threshold) state. The boosted channel is divided into the first channel Ch1 and the second channel Ch2 due to the cut-off voltage Vco.

Due to the channel division, the boosted channel voltage of the second channel Ch2 which includes the channel of memory cell provided with program voltage Vpgm is independent from the boosted channel voltage of the first channel voltage. Consequently, voltage drop at the second channel Ch2 can be blocked. As a result, the program disturbance problem can be solved. As mentioned above, the dummy word line can be used to block the charge sharing effect by supplying the cut-off voltage Vco. In the case where more memory cells are included per cell string (i.e, 64 cell/string), the program disturbance problem caused from the charge sharing can be solved.

FIG. 13 is a diagram showing a bias condition of a cell string including the dummy word line DWL during the program operation. In the explanation of the present embodiment, the program operation about the memory cells being located in upper side of the dummy word line DWL will be described. The memory cells being located in lower side of the dummy word line DWL is supplied with pass voltage during the program operation. Referring to FIG. 13, the bias condition can be classified into two program cases, a first program case (CASE1) where the cut-off voltage Vco is supplied to the dummy word line DWL and a second program case (CASE2) wherein the pass voltage Vpass or the cut-off voltage is supplied to the dummy word line DWL.

In the first case (CASE1) will now be described where the memory cells being located in upper side of the dummy word line DWL is programmed and the dummy word line is always supplied with cut-off voltage. The cell string can be inhibited from program operation by a self-boosting or by a local self-boosting scheme in the first case (CASE1). In the case of self-boosting, the source voltage is applied to the bit line BL and the string selection line SSL during the program voltage Vpgm is applied to the selected word lien WL<N>. Further, the pass voltage Vpass is applied to the unselected word line, the ground voltage Vss is applied to the ground selection line GSL, and the source line voltage $V_{CSL}$ is applied to the common source line CSL. The cut-off voltage Vco is applied to the dummy word line DWL. Herein, the cut-off voltage Vco is applied to the dummy word line when the program voltage Vpgm is applied to a word line adjacent to the dummy word line (i.e, WL<N>). Moreover, the cut-off voltage Vco is applied to the dummy word line when the program voltage Vpgm is applied to a word line which is not adjacent to the dummy word line. In the first case (CASE1), the cut-off voltage Vco is applied to the dummy word line during the program operation of the memory cells located in an upper side of the dummy word line DWL.

The first program case (CASE1) can be applied to the program inhibit operation by the local self-boosting scheme. Namely, source voltage Vcc is applied to the bit line BL and the string selection line SSL during the program voltage Vpgm is applied to the selected word line WL<N+2>. Further, the pass voltage Vpass is applied to the unselected word lines which include the word line WL<N> adjacent to the dummy word line. Moreover, the ground voltage Vss is applied to the word line WL<N+1> which lies adjacent to the selected word line WL<N+2> for forming a local channel. The ground voltage Vss is applied to the ground selection line GSL, and the source line voltage $V_{CSL}$ is applied to the common source line CSL. The cut-off voltage Vco is applied to the dummy word line DWL. Herein, the depicted local self-boosting scheme is an exemplary embodiment among the plurality of local self-boosting schemes for convenient illustration of the present embodiment. The cut-off voltage Vco will be applied to the dummy word line DWL according to whichever local self-boosting scheme is applied to the program inhibited cell string.

In the second program case (CASE2), the bias condition varies in accordance with whether or not the selected word line for programming is adjacent to the dummy word line DWL. If the word line WL<N> adjacent to the dummy word line DWL is selected for programming, the pass voltage Vpass is applied to the dummy word line DWL for minimizing a voltage drop of the program voltage Vpgm from the coupling effect. The cut-off voltage Vco for dividing the boosted channel can affect the program voltage Vpgm of the selected word line WL<N> due to its relatively low voltage level. As such, the pass voltage Vpass is applied to the dummy word line DWL. However, if a word line that is not adjacent to the dummy word line DWL is selected for programming, the cut-off voltage Vco is applied to the dummy word line DWL, like the first program case (CASE1). Simultaneously, the source voltage Vcc is applied to the bit line BL and the string selection line SSL. The pass voltage Vpass is applied to the unselected word line, the ground voltage is applied to the ground selection line GSL, and the source line voltage $V_{CSL}$ is applied to the common source line CSL.

In the second program case (CASE2), the program inhibit operation can be executed by the self-boosting scheme or local self-boosting scheme. In the program operation with the self-boosting scheme, the cut-off voltage Vco is applied to the dummy word line except for the case where the word line WL<N> adjacent to the dummy word line DWL is selected for programming. Such a bias condition of the dummy word line DWL is valid for a local self-boosting scheme. Namely, when the program voltage Vpgm is applied to the selected word line WL<N+2>, the source voltage Vcc is applied to the bit line BL and the string selection line SSL. Further, the pass voltage Vpass is applied to the unselected word lines which includes the word line WL<N> adjacent to the dummy word line DWL. The ground voltage Vss is applied to the word line WL<N+1> that is adjacent to the selected word line WL<N+2> for forming the local channels. The ground voltage Vss is applied to the ground selection line GSL, and the source line voltage $V_{CSL}$ is applied to the common source line CSL. The cut-off voltage Vco is applied to the dummy word line DWL.

Figure 14:
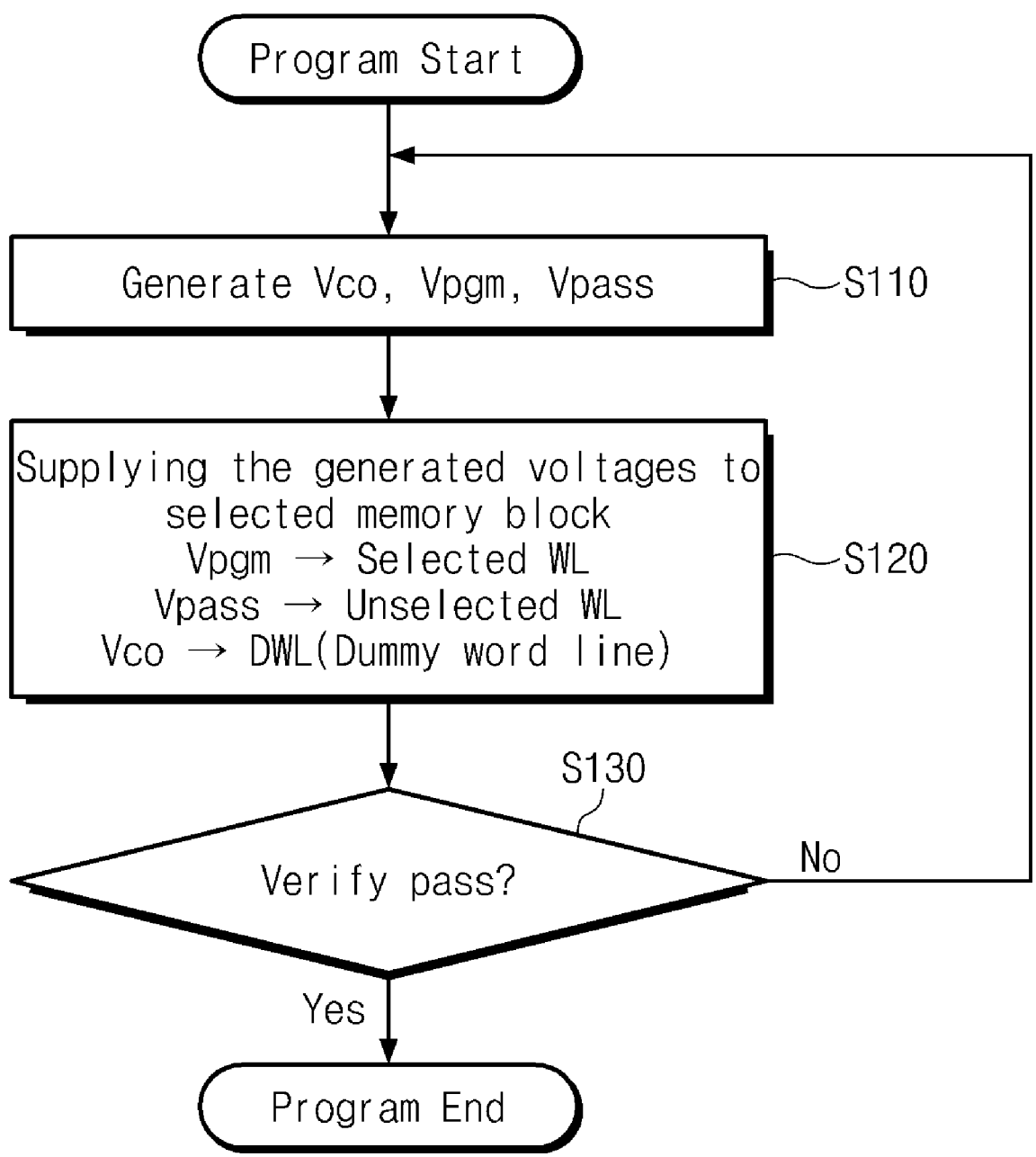
FIG. 14 is a flowchart illustrating a program method according to an embodiment of the present invention.

FIG. 14 is a flowchart illustrating a method of programming in accordance with the first program case (CASE1). When the program operation starts, the high voltage to be applied to the word lines and dummy word lines is generated. That is, the high voltage generator 350 generates the cut-off voltage Vco, the program voltage Vpgm, and the pass voltage Vpass (S110).

The generated voltages are applied to the selected word line, the unselected word lines and the dummy word lines. That is, the program voltage Vpgm is applied to the selected word line, the pass voltage is applied to the unselected word lines, and the cut-off voltage is applied to the dummy word line DWL (S120). Next, a verify operation is conducted to verify the program operation (S130). If all the selected memory cells for programming are programmed to the target state, the program operation for programming the selected word line is deemed complete. However, if any one of the selected memory cells is not programmed to the target state, the steps S110 to S130 are repeated until all memory cells are sufficiently programmed to the target state.

Figure 15:
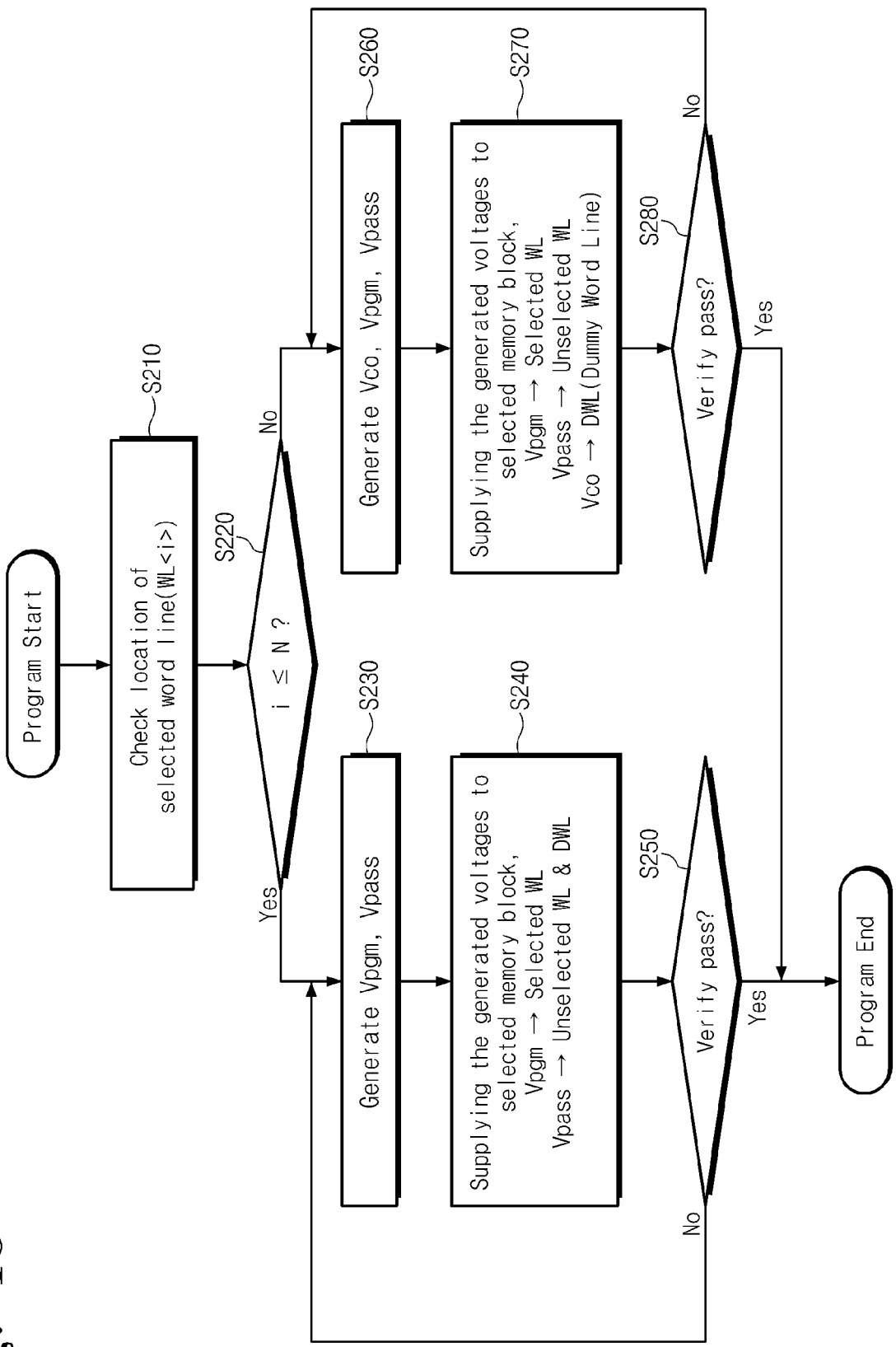
FIG. 15 is a flowchart illustrating a program method according to another embodiment of the present invention.

FIG. 15 is a flowchart illustrating the above-described second program case (CASE2). Referring to FIG. 15, in the case of a program operation where a program voltage is applied to a word line adjacent to a dummy word line DWL, the dummy word line DWL is exceptionally supplied with a pass voltage Vpass. This will be described below in detail.

When a program operation starts, the location i of a selected word line WL<i> is detected to determine whether the selected word line WL<i> is a word line adjacent to a dummy word line DWL (S210). If the selected word line WL<i> is located to be even with or lower than a word line WL<N> adjacent to the dummy word line DWL, this routine proceeds to a step where the dummy word line DWL is supplied with the pass voltage Vpass at the time of applying a program voltage Vpgm. However, if the selected word line WL<i> is located higher than the word line WL<N> adjacent to the dummy word line DWL, this routine proceeds to a step where the dummy word line DWL is supplied with a cut-off voltage Vco at the time of applying the program voltage Vpgm (S220).

If the selected word line WL<i> is located even with or lower than the word line WL<N> adjacent to the dummy word line DWL, a high voltage generator 350 generates a program voltage Vpgm and a pass voltage Vpass to be applied to a word line and a dummy word line DWL (S230). The program voltage Vpgm and the pass voltage Vpass are applied to selected and unselected word lines and the dummy word line DWL. The program voltage Vpgm is applied to the selected word line, and the pass voltage Vpass is applied to the unselected word lines and the dummy word line DWL (S240). Next, a verify operation is conducted to verify the program operation (S250). If all the selected memory cells for programming are programmed to the target state, the program operation for programming the selected word line is deemed complete. However, if any one of the selected memory cells is not programmed to the target state, the step S230 is repeated until all memory cells are sufficiently programmed to the target state.

If the selected word line WL<i> is located higher than the word line WL<N> adjacent to the dummy word line DWL, the high voltage generator 350 generates a cut-off voltage Vco, a program voltage Vpgm, and a pass voltage Vpass (S260). The program voltage Vpgm and the pass voltage Vpass are applied to a selected word line and unselected word lines, respectively. Next, a verify operation is conducted to verify the program operation (S270). If all the selected memory cells for programming are programmed to the target state, the program operation for programming the selected word line is deemed complete. However, if any one of the selected memory cells is not programmed to the target state, the step S260 is repeated until all memory cells are sufficiently programmed to the target state.

According to the above-described second program case (CASE2), when a word line WL<N> adjacent to a dummy word line DWL is programmed, the dummy word line DWL is supplied with a pass voltage Vpass. Thus, the coupling effect on a word line may be suppressed due to a relatively low cut-off voltage Vco applied to the dummy word line DWL.

FIG. 16 is a table illustrating bias conditions during an erase operation of a flash memory device according to an embodiment of the present invention. Referring to FIG. 16, dummy cells connected to a dummy word line may be managed depending on a first erase case (CASE1) and a second erase case (CASE2).

In the first erase case (CASE1), an erase operation of dummy cells is blocked to maintain a previously programmed state corresponding to a highest threshold voltage. During a block erase operation, a dummy word line DWL may be floated to block an erase operation based on F-N tunneling.

In the second erase case (CASE2), after erasing dummy cells simultaneously to memory cells during a block erase operation, the dummy cells are programmed to a state corresponding to a highest threshold voltage. As a result, the dummy cells are programmed to the state corresponding to the highest threshold voltage after being erased. That is, the erase operation of the dummy cells is followed by the program operation thereof.

Figure 17:
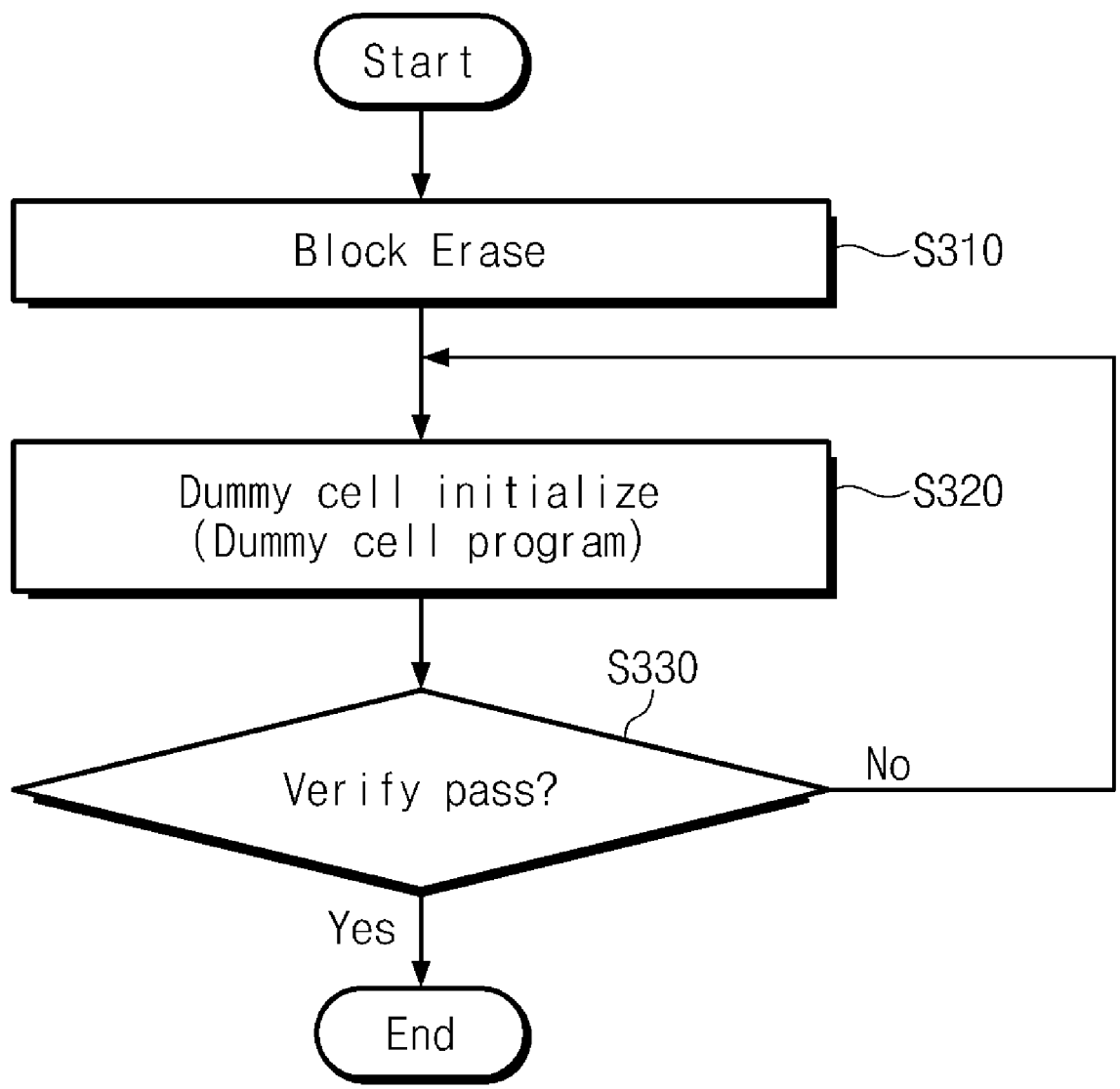
FIG. 17 is a flowchart illustrating programming of a dummy cell.

FIG. 17 is a flowchart illustrating the second erase case (CASE2). Referring to FIG. 17, a block erase operation is conducted (S310). A dummy cell program operation is conducted to initialize dummy cells (S320). During the dummy cell program operation, a verify operation is conducted to determine whether a threshold voltage of the dummy cells reaches a highest state (S330). If the verify result is that the dummy cell program operation is normally conducted, the initialization of the dummy cells is completed. However, if the threshold voltage of the dummy cells does not reach a target threshold voltage, this routine proceeds to a step S320 in which the dummy cells are reprogrammed.

Figure 18:
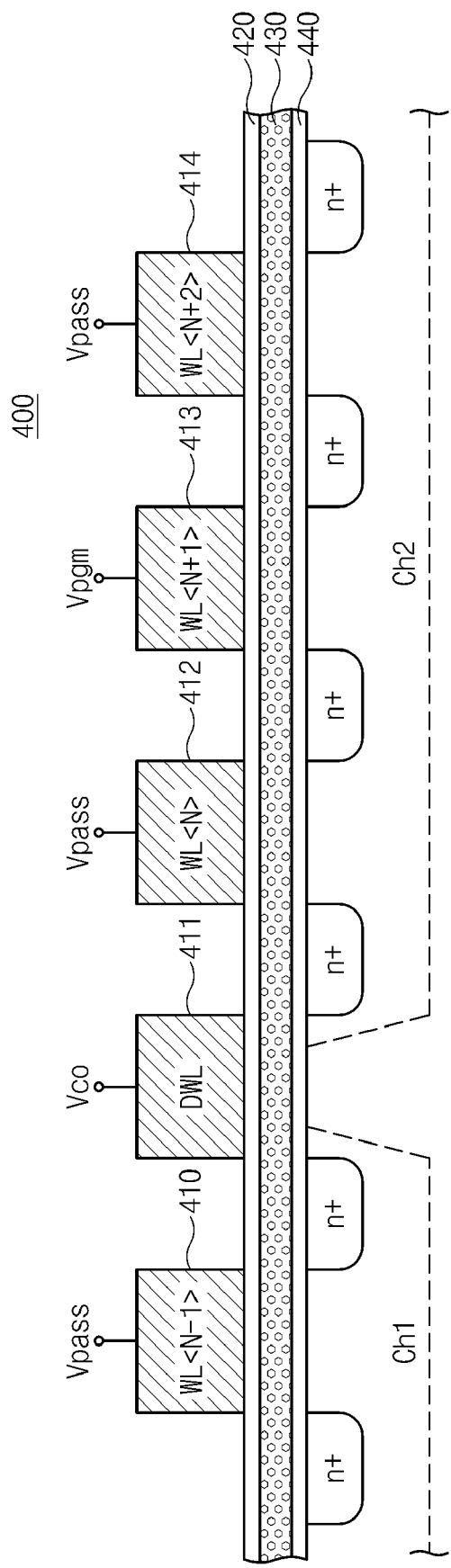
FIG. 18 shows a cell string section of a charge trap type flash memory device according to an exemplary embodiment of the present invention.

FIG. 18 shows a string cross section 400 of a charge trap type flash memory device capable of enhancing a channel boosting efficiency using a dummy word line DWL. The charge trap type flash memory device includes a charge trap layer 430 made of a non-conductive material. The charge trap layer 430 is formed between oxide layers 420 and 440. Charges injected by the F-N tunneling during a program operation are trapped to the charge trap layer 430 to store data. During the program operation, in a string set to program inhibit, channels Ch1 and Ch2 are divided based on the dummy word line DWL supplied with a cut-off voltage Vco. Charge sharing between the divided channels Ch1 and Ch2 may be blocked to maintain a voltage of the boosted second channel Ch2 and prevent program disturbance. As an integration density of a charge trap type flash memory device increases, program disturbance cannot be avoided. For this reason, a dummy word line DWL may be formed between word lines to prevent the program disturbance. While FIG. 18 shows that the charge trap layer 430 and the oxide layers 420 and 440 are successively formed to the respective memory cells, the illustration is merely exemplary. A program method or a program inhibit method according to the present invention may be applied to any charge trap type NAND flash memory device.

Figure 19:
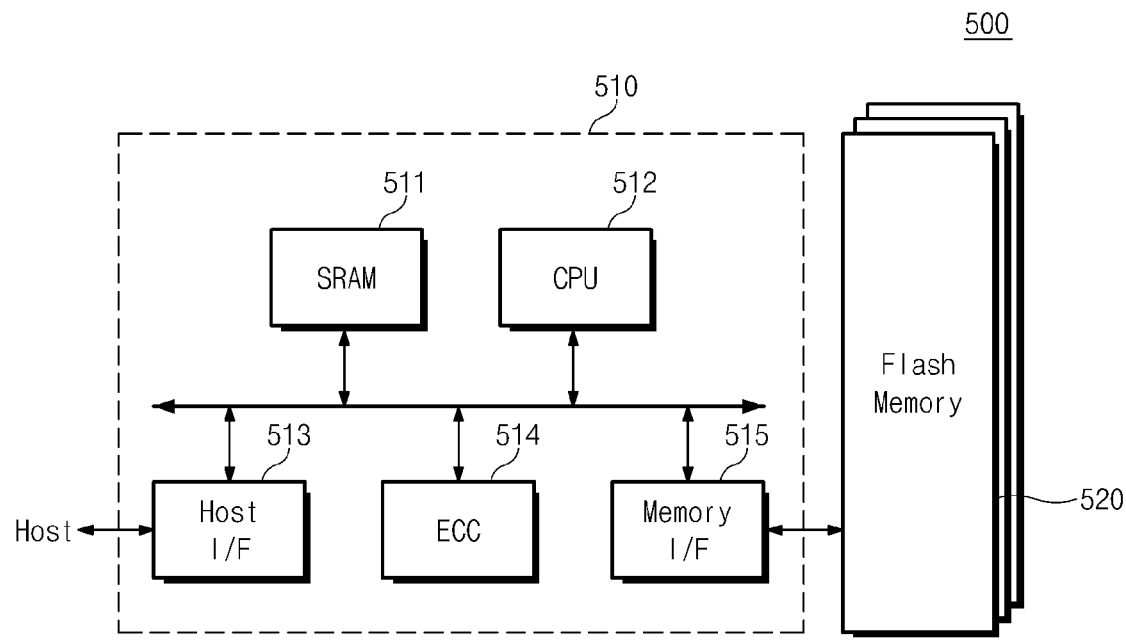
FIG. 19 is a block diagram of a memory system including a flash memory device according to the present invention.

FIG. 19 is a block diagram of a memory system 500 including a flash memory device 520 conducting a program operation according to the present invention. Referring to FIG. 19, the memory system 500 may include the flash memory device 520 and a memory controller 510. The flash memory device 520 is substantially identical to any one of the flash memory devices shown herein and thus its explanation thereof is be omitted here to avoid redundancy. The memory controller 510 may be configured to control the flash memory device 520. The flash memory device 520 and the memory controller 510 may be merged as a memory card or a solid state disk (SSD).

An SRAM 511 is used as an operation memory of a processing unit 512. A host interface has a data exchange protocol of a host connected to the memory system 500. An error correction circuit (ECC) detects and corrects error included in data read out of the flash memory device 520. The memory interface 514 interfaces with the flash memory device 520. The processing unit 512 conducts general control operations for data exchange of the memory controller 512. Although not shown in this figure, it will be understood by persons of ordinary skill in the art that the memory system 500 may be provided with a ROM configured to store code data for interfacing with the host. The flash memory device 520 may be provided to a multi-chip package including a plurality of flash memory chips.

According to the above-described memory system 500, program disturb characteristics resulting from high integration may be conspicuously improved to be provided as a high-capacity and high-reliability storage medium. Especially, the flash memory device according to the present invention may be provided for a memory system such as a solid state disk (SSD) which is being actively studied in recent years. In this case, the memory controller 510 may be configured to communicate with the outside (e.g., host) through one of various interface protocols such as USB, MMC, PCI-E, SATA, PATA, SCSI, ESDI, and IDE.

Flash memory devices are non-volatile memory device which can hold their stored data even when their power supplies are interrupted. With the increase in use of mobile devices such as cellular phones, personal digital assistants (PDAs), digital cameras, portable game consoles, and MP3 players, flash memory devices have been widely used as not only data storages but also code storages. Moreover, flash memory devices may be used in home applications such as HDTV sets, DVD players, routers, global positioning systems (GPS).

Figure 20:
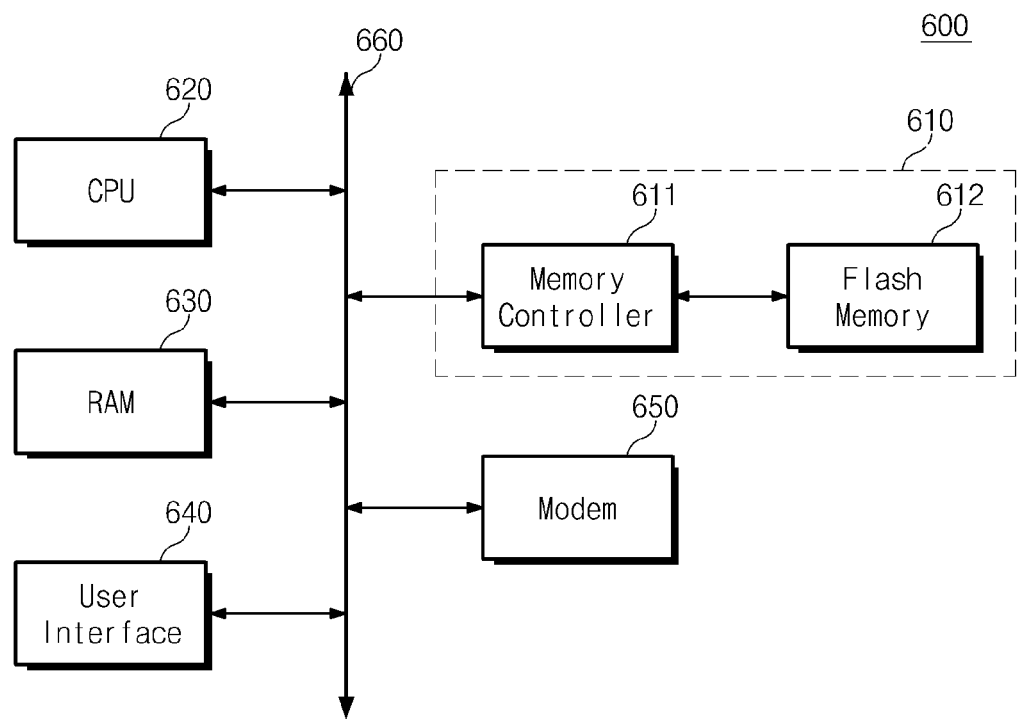
FIG. 20 is a block diagram of a computing system including a memory system according to the present invention.

FIG. 20 schematically shows a computing system 600 including a flash memory device 612 according to the present invention. The computing system 600 includes a microprocessor 620 electrically connected to a system bus 660, a RAM 630, a user interface 640, a modem 650 such as a baseband chipset, and a memory system 610. The memory system 610 includes a memory controller 611 and a flash memory device 612. The flash memory device 612 may have the same configuration as described herein. N-bit data (N being 1 or greater integer) processed/to be processed by the microprocessor 620 may be stored in the flash memory device 612 through the memory controller 611. In the case where a computing system according to the present embodiment is a mobile device, a battery (not shown) may be additionally provided to apply an operation voltage of the computing system. Although not shown in this figure, it will be understood by persons of ordinary skill in the art that the computing system according to the present invention will be further provided with an application chipset, a camera image processor (CIS), and a mobile DRAM. The memory controller 611 and the flash memory device 612 may constitute, for example, a solid state disk/drive (SSD) using a non-volatile memory to store data.

The flash memory device and/or memory controller, according to various embodiments of the present invention may be packaged. For example, the flash memory device and/or memory controller may be packaged using packages such as Package on Packages (PoPs), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive. While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A non-volatile memory device, comprising:
   a selection transistor coupled to a bit line;
   a plurality of memory cells serially coupled to the selection transistor; and
   at least one dummy cell disposed between the plurality of memory cells, the at least one dummy cell being turned off during a programming operation of a memory cell located between the dummy cell and the selection transistor.

2. The non-volatile memory device as set forth in claim 1, wherein the dummy cell is programmed to a highest threshold voltage state among a plurality of programmable threshold voltage states of the plurality of memory cells.

3. The non-volatile memory device as set forth in claim 1, wherein the bit line is supplied with a source voltage during the programming operation.

4. The non-volatile memory device as set forth in claim 3, wherein a gate of the dummy cell is supplied with a blocking voltage during the programming operation, the blocking voltage being lower than a pass voltage.

5. The non-volatile memory device as set forth in claim 1, wherein a gate of the dummy cell is configured to be in a voltage float state during an erase operation.

6. The non-volatile memory device as set forth in claim 1, wherein, after an erase operation, the dummy cell is programmed to a highest threshold voltage state among a plurality of programmable threshold voltage states of the plurality of memory cells.

7. The non-volatile memory device as set forth in claim 1, wherein the dummy cell is configured to be turned-on during a programming operation of a memory cell which is not located between the dummy cell and the selection transistor.

8. A non-volatile memory device, comprising:
   a selection transistor coupled to a bit line;
   a plurality of memory cells serially coupled to the selection transistor; and
   at least one dummy cell disposed between the plurality of memory cells, the at least one dummy cell being selectively turned-off according to a location of a programmed one of the plurality of memory cells during a programming operation.

9. The non-volatile memory device as set forth in claim 8, wherein the dummy cell is turned off when the programmed memory cell is located between the dummy cell and the selection transistor.

10. The non-volatile memory device as set forth in claim 8, wherein the dummy cell is turned on when the programmed memory cell is located between the dummy cell and the selection transistor and adjacent to the dummy cell.

11. The non-volatile memory device as set forth in claim 8, wherein the dummy cell is turned on when the programmed memory cell is not located between the dummy cell and the selection transistor.

12. The non-volatile memory device as set forth in claim 8, wherein the dummy cell is programmed to a highest threshold voltage state among a plurality of programmable threshold voltage states of the plurality of memory cells.

13. The non-volatile memory device as set forth in claim 12, wherein the dummy cell is turned on by application of a pass voltage.

14. The non-volatile memory device as set forth in claim 13, wherein the dummy cell is turned off by application of a blocking voltage, the blocking voltage being lower than a pass voltage.

15. The non-volatile memory device as set forth in claim 8, wherein the dummy cell includes at least two cell transistors.

16. The non-volatile memory device as set forth in claim 8, wherein a gate of the dummy cell is configured to be in a voltage float state during an erase operation.

17. The non-volatile memory device as set forth in claim 8, wherein, after an erase operation, the dummy cell is programmed to a highest threshold voltage state among a plurality of programmable threshold voltage states of the plurality of memory cells.

18. A method for programming a non-volatile memory device, comprising:

floating the channel of a program inhibited cell string; and boosting the floated channel into a plurality of channel areas, the plurality of channel areas being separated from the floated channel by turning off a dummy cell located between a plurality of memory cells of the cell string.

19. The method of claim 18, wherein the dummy cell is programmed to a highest threshold voltage state among a plurality of programmable threshold voltage states of the plurality of memory cells.

20. The method of claim 18, wherein the dummy cell is supplied with a blocking voltage when boosting the floated channel into a plurality of channel areas, the blocking voltage being lower than a pass voltage.

* * * * *